(12) United States Patent
Mei et al.

(10) Patent No.: US 7,994,509 B2
(45) Date of Patent: Aug. 9, 2011

(54) STRUCTURE AND METHOD FOR THIN FILM DEVICE WITH STRANDED CONDUCTOR

(75) Inventors: Ping Mei, Palo Alto, CA (US); Hao Luo, Palo Alto, CA (US); Carl Taussig, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1378 days.

(21) Appl. No.: 11/264,321

(22) Filed: Nov. 1, 2005

(65) Prior Publication Data
US 2007/0096169 A1 May 3, 2007

(51) Int. Cl.
*H01L 29/10* (2006.01)
(52) U.S. Cl. .............. 257/66; 257/E23.175; 438/758
(58) Field of Classification Search ............ 257/66, 257/324, 344, E23.177, E23.175, E23.169, 257/E23.168; 438/758
See application file for complete search history.

(56) References Cited

U.S. PATENT DOCUMENTS

| | | | |
|---|---|---|---|
| 3,525,617 A * | 8/1970 | Bingham | 430/312 |
| 6,028,333 A | 2/2000 | Yamazaki et al. | |
| 6,184,559 B1 * | 2/2001 | Hayakawa et al. | 257/401 |
| 6,281,552 B1 * | 8/2001 | Kawasaki et al. | 257/350 |
| 6,351,841 B1 | 2/2002 | Tickle | |
| 6,385,075 B1 | 5/2002 | Taussig et al. | |
| 6,476,419 B1 | 11/2002 | Yasuda | |
| 6,593,624 B2 * | 7/2003 | Walker | 257/344 |
| 6,808,646 B1 | 10/2004 | Jeans | |
| 7,056,834 B2 * | 6/2006 | Mei et al. | 438/758 |
| 7,341,893 B2 * | 3/2008 | Mei et al. | 438/149 |
| 2004/0002216 A1 | 1/2004 | Taussig et al. | |
| 2004/0217085 A1 | 11/2004 | Jeans | |
| 2004/0235227 A1 * | 11/2004 | Kawase | 438/158 |
| 2005/0161832 A1 * | 7/2005 | Saeki | 257/775 |
| 2006/0017154 A1 * | 1/2006 | Eguchi et al. | 257/701 |

* cited by examiner

*Primary Examiner* — Thao X Le
*Assistant Examiner* — William F Kraig

(57) ABSTRACT

Provided is a thin film device and an associated method of making a thin film device. For example, fabrication of an inverter thin film device is described. Moreover, a parallel spaced electrically conductive strips are provided upon a substrate. A functional material is deposited upon the conductive strips. A 3D structure is then provided upon the functional material, the 3D structure having a plurality of different heights, at least one height defining a first portion of the conductive strips to be bundled. The 3D structure and functional material are then etched to define a TFD disposed above the first portion of the conductive strips. The first portion of the conductive strips is bundled adjacent to the TFD.

21 Claims, 19 Drawing Sheets

Ez (Arbitrary Unit)

STRUCTURE AND METHOD FOR THIN FILM DEVICE WITH STRANDED CONDUCTOR

FIELD OF THE INVENTION

The present invention relates generally to the field of forming semiconductor devices and, in particular, to a structure and method of forming a thin film device such as an inverter and or other device and circuit components.

BACKGROUND

Socially and professionally, most people rely upon video displays in one form or another for at least a portion of their work and/or recreation. With a growing demand for large screens and high definition television (HDTV), cathode ray tubes (CRTs) have largely given way to displays composed of liquid crystal devices (LCDs), light emitting diodes (LEDs), plasma display panels (PDPs), or front or rear projection systems.

A CRT operates by a scanning electron beam exciting phosphorous-based materials on the back side of a transparent screen, wherein the intensity of each pixel is commonly tied to the intensity of the electron beam. With an LED and plasma display, each pixel is an individual light-emitting device capable of generating its own light. With an LCD display, each pixel is a transient light-emitting device, individually adjusted to permit light to shine through or reflect through the pixel by altering the polarization of the transmitted or reflected light.

As LCD, plasma and LED screens do not utilize a large tube, as in a CRT, LCD, plasma and LED screens may be quite thin and, in many cases, are lighter than comparable CRT displays. As such, large and small flat screen displays can be provided to improve the portability of laptop computers, video displays in vehicles and airplanes, and information displays that are mounted or set in eye-catching locations.

A plurality of thin film devices, are typically incorporated into the screens of such flat screen devices as LCD, plasma and LED displays. One or more transistors are commonly used to control the behavior of each pixel within the display. The individual of each pixel of an LED, plasma or LCD display introduces the possibility that each pixel may provide a different quantity of light. One pixel may be brighter or darker than another, a difference that may be quite apparent to the viewer. Circuit components such as logic gates and interconnects are typically used to control the transistors and or other components.

As a flat screen display may incorporate hundreds of thousands of thin film devices, great care is generally applied in the fabrication of LED, plasma and LCD displays in an attempt to ensure that the pixels and their controlling circuits are as uniform and consistently alike as is possible. Frequently, especially with large displays, quality control measures discard a high percentage of displays before they are fully assembled. As such, displays are generally more expensive than they otherwise might be, as the manufacturers must recoup the costs for resources, time and precise tooling for both the acceptable displays and the unacceptable displays.

Traditionally, thin film devices have been formed through processes such as photolithography. In a photolithographic process, a substrate is provided and at least one material layer is uniformly deposited upon the substrate. A photo-resist layer, also commonly known simply as a photoresist, or even simply a resist, is deposited upon the material layer, typically by a spin coating machine. A mask is then placed over the photoresist and light, typically ultra-violet (UV) light, is applied through the mask to expose portions of the photoresist. During the process of exposure, the photoresist undergoes a chemical reaction. Generally, the photoresist will react in one of two ways.

With a positive photoresist, UV light changes the chemical structure of the photoresist so that it is soluble in a developer. What "shows" therefore goes, and the mask provides a copy of the patterns which are to remain—such as, for example, the trace lines of a circuit. Photolithography may also be considered a 2D process, in that each layer of material is deposited and then masked. Although 3D structure may be created by stacking layers patterned via the 2D process, there is no inherent alignment feature between the layers.

A negative photoresist behaves in the opposite manner—the UV exposure cause it to polymerize and not dissolve in the presence of a developer. As such, the mask is a photographic negative of the pattern to be left. Following the developing with either a negative or positive photoresist, blocks of photoresist remain. These blocks may be used to protect portions of the original material layer, or serve as isolators or other components.

Very commonly, these blocks serve as templates during an etching process, wherein the exposed portions of the material layer are removed, such as, for example, to establish a plurality of conductive rows.

The process may be repeated several times to provide the desired thin film devices. As such, new material layers are set down on layers that have undergone processing. Such processing may inadvertently leave surface defects and/or unintended contaminant particles in the prior layers.

With respect to thin film transistors ("TFTs"), there are two types—bottom-gate transistors and top gate transistors. Bottom-gate transistors incorporating amorphous silicon are generally more desirable than top gate amorphous silicon transistors. This is due in part to better device performance in terms of a higher electron field effect mobility and a lower off-state leakage current.

Although desirable, the fabrication of bottom-gate amorphous silicon transistors requires precise alignment between source/drain contacts and the gate electrode. In a typical bottom-gate transistor structure, a metal gate material is formed on a substrate. A desired gate electrode is then formed by a conventional photolithographic process.

Summarized, a dielectric layer is formed over the gate metal, and a layer of active material in which a channel will be formed is deposited over the dielectric layer. In many instances a contact layer, such as, for example, a-Si:H doped to be N+, is deposited over the semiconductor layer prior to the deposition of a top metal layer.

Lithography, or a similar process, and subsequent etching processes are then employed to remove a section of the top metal layer and contact layer (if provided), lying roughly over the gate metal. This removal forms the gate and drain contact electrodes. Since photolithography and etching processes may introduce at least 1 μ alignment error, there are overlaps between source/drain contacts and the gate electrode by design, to ensure the electrical continuity between the source and drain when the TFT channel is at an on state.

While leaving the overlaps alleviates the alignment problem, there are several drawbacks and therefore reasons to minimize the amount of overlap. For example, the overlap causes the channel to be longer than otherwise would be necessary, which in turn limits the reduction in size of the overall structure. The TFT source to drain current is proportional to the ratio of the channel width to the channel length. Reducing the overlaps shrinks the length of the transistor, and thus provides more room for other components that may be required for an eventual device.

Furthermore, and perhaps most importantly, parasitic capacitance is established between the source/drain electrode material and the gate material in the areas of overlap. This parasitic capacitance results in feed-through voltage. When the TFT is incorporated into a display backplane to control a display pixel, this may result in inadvertent turning on of the pixel. This uncontrolled behavior results in image flicker (inaccuracy in the Off-to-On transition of the TFT), and sticking (inaccuracy in the On-to-Off transition of the TFT) in the case of a display device. In the case of a sensor device, parasitic capacitance results in readout noise.

Further, due to variations in the substrate, resolution of the lithography, alignment of the lithographic mask and other factors, the overlap may vary from TFT to TFT in an array. Such variance thus permits a variance in feed-through voltage from TFT to TFT. More simply stated, the plurality of TFTs in the array will have a range of different performance factors. As the TFT's are generally not the only components being formed, issues of alignment, misalignment and overlap generally apply to other components and devices as well.

Photolithography is a precise process applied to small substrates. In part, this small-scale application is due to the high cost of the photo masks. For the fabrication of larger devices, typically, rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. This is unfortunate as the use of a flexible substrate may be desired in certain applications, such as for example to provide a light weight structure or roll-to-roll fabrication processing.

In addition, a flexible substrate is not flat—it is difficult to hold flat during the imprinting process and thickness and surface roughness typically cannot be controlled as well as with glass or other non-flexible substrates. The issue of flatness in photolithography can be a problem because the minimum feature size that can be produced by a given imaging system is proportional to the wavelength of the illumination divided by the numerical aperture of the imaging system. However, the depth of field of the imaging system is proportional to the wavelength of the illumination divided by the square of the numerical aperture. Therefore, as resolution is increased, the flatness of the substrate quickly becomes the critical issue.

With respect to the flat screen displays introduced above, use of flexible substrates for the internal backplane controlling the pixels is often desired. Such a flexible substrate can provide a display with flexible characteristics. A flexible substrate may also be easier to handle during fabrication and provide a more mechanically robust display for the user.

Hence, there is a need for a process to provide at least one thin film device that overcomes one or more of the drawbacks identified above.

SUMMARY

The present disclosure advances the art by providing at least one TFD.

In particular, and by way of example only, according to an embodiment, provided is a method of forming at least one TFD with stranded conductor, including: providing a substrate; providing a plurality of parallel spaced electrically conductive strips upon the substrate; depositing functional material upon the conductive strips; provide a 3D structure upon the functional material, the 3D structure having a plurality of different heights, at least one height defining a first portion of the conductive strips to be bundled; etching the 3D structure and functional material to define a TFD disposed above the first portion of the conductive strips; and bundling the first portion of the conductive strips adjacent to the TFD.

In yet another embodiment, provided is a TFD, including: a substrate; a plurality of parallel spaced electrically conductive strips upon the substrate; a bottom stranded conductor provided by a bundled subset of conductive strips; at least one thin film device layer disposed upon at least a portion of the bundled subset of conductive strips; and a second conductor adjacent to the thin film device layer and separate from the bundled subset of conductive strips.

DETAILED DESCRIPTION

Figure 1:
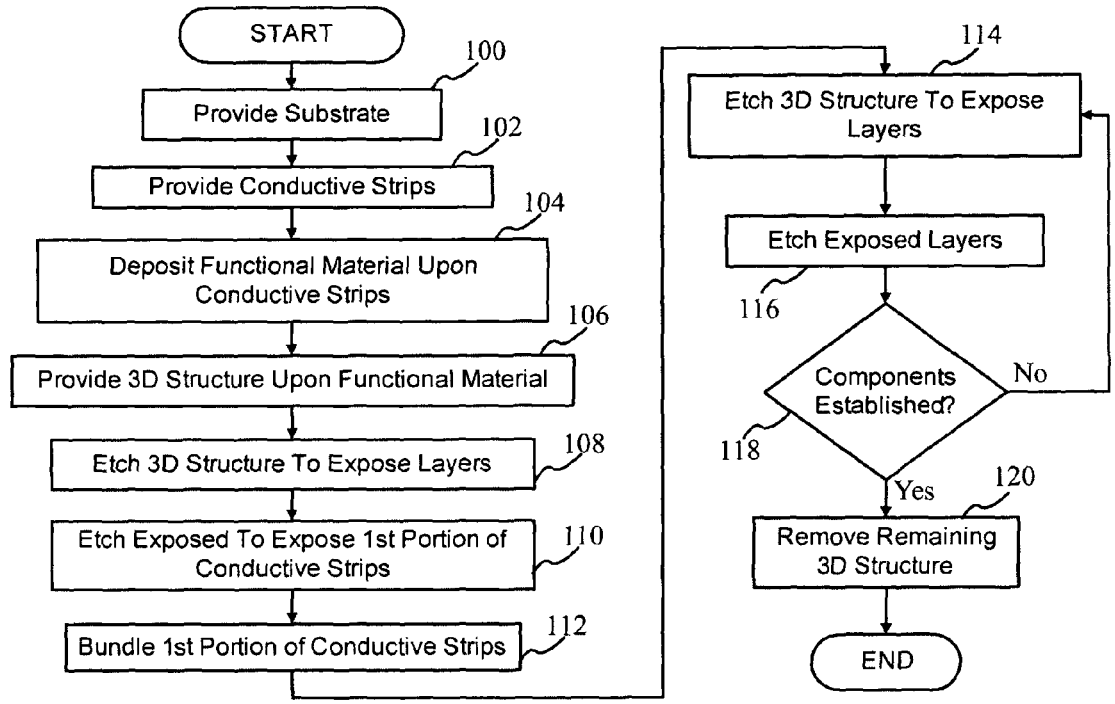
FIG. 1 is a high level flowchart of at least one method embodiment.

Before proceeding with the detailed description, it is to be appreciated that the present teaching is by way of example, not by limitation. Thus, although the instrumentalities described herein are for the convenience of explanation shown and described with respect to exemplary embodiments of thin film devices ("TFDs") and specifically an inverter, it will be appreciated that the principles herein may be applied equally in other types of thin film devices ("TFDs").

In at least one embodiment, the method for forming at least one TFD incorporates Self-Aligned Imprint Lithography ("SAIL"), a recently developed technique for producing multilayer patterns on flexible substrates. The basics of this process are set forth and described in U.S. patent application Ser. No. 10/184,567, published as US Patent Publication Number 040002216, now U.S. Pat No. 6,861,365, the disclosure of which is incorporated herein by reference.

The SAIL technique uses a 3D patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing.

Utilizing height differences in an imprinted 3D stamp or other provided 3D structure, multi-level pattern information is provided and self-alignment maintained independent of the instability of a flexible substrate. It shall also be realized that the disclosed method may be employed upon a non-flexible substrate while remaining within the spirit and scope of at least one embodiment.

Referring now to the drawings, FIG. 1 through FIG. 19 conceptually illustrate at least one embodiment of providing a TFD, and more specifically an inverter with a bottom stranded conductor. It will be appreciated that the described process need not be performed in the order in which it is herein described, but that this description is merely exemplary of at least one preferred method of performing a process to form at least one TFD with a bottom stranded conductor. In addition, it is understood and appreciated that the vertical scale of the components and features illustrated in the Figures has been exaggerated to facilitate ease of discussion.

FIG. 1 is a high-level flowchart of a method for forming at least one TFD having a stranded bottom conductor. As indicated in block 100, the process is generally commenced by providing a substrate. In at least one embodiment, the substrate is flexible.

A plurality of parallel spaced conductive strips are then provided upon the substrate, block 102. Upon the established conductive strips, a functional material appropriate for the desired thin film device is deposited, block 104. Functional material may include electronic, biologic, optical, thermal, chemical, and combinations thereof. In at least one embodiment, the functional material includes at least one thin film device layer.

A 3D structure is then provided upon the functional material layer, block 106. It is to be appreciated that under the present method the functional material, such as at least one thin film layer, are advantageously deposited before etching is performed. As such, deposition conditions for the functional material are not limited by material properties of the 3D structure.

As discussed below, the 3D structure in at least one embodiment is formed from an imprint polymer. In addition, the 3D structure has a plurality of different heights. At least one height defines a first portion of the conductive strips to be bundled. As in block 108, the 3D structure is etched to expose portions of the thin film layers. The exposed portions of the thin film layers are then etched as well to expose the first portion of conductive strips, block 110.

The exposed first portion of conductive strips is then bundled, block 112. In at least one embodiment, the bundling serves to also interconnect a first layer of the thin film device with a second layer of the thin film device. Etching of the 3D structure, block 114, and the exposed portions of the thin film layers, block 116, is repeated so as to define the desired components for the device, decision 118.

More specifically, etching of the 3D structure and the resulting exposed portions of the thin film layers is alternated so as to provide elements such as for example a source electrode, a drain electrode, and a channel. In at least one embodiment, the etching as patterned by the 3D structure also establishes at least one cut-off via severing a second portion of the conductive strips adjacent to the first portion of the conductive strips which are bundled. The etching processes, bundling process, and cut-off process serve to ensure that the stranded bottom conductor is aligned to the established TFD.

As the 3D structure is fixed directly upon the thin film layers and moves with those films, the varying levels of the structure provide alignment to define device features without frustration from flexible distortion of the substrate, the stacked thin film layers and the 3D structure. In at least one embodiment, following the formation of the desired components, the remaining 3D structure is removed, block 120.

Turning to the remaining figures, provided is a more detailed illustration of the initial process described above and an exemplary thin film device. For purposes of discussion and illustration of stranded conductor alignment, vertical interconnection and isolation, the fabrication of a thin film device (TFD) such as a logical inverter (also commonly referred to as a NOT gate) will be discussed.

A logic gate is an elementary building block of a digital circuit. Perhaps the simplest of all logic gates, an inverter takes one bit as input and produces the opposite bit as an output. As shown in the circuit diagram of FIG. 2, in inverter 200 there are two transistors in series. The drain of the first transistor 202 is connected to the source of the second transistor 204. This node provides output voltage. When the input voltage, Vin is high, the first transistor is ON and the output voltage Vout, is low (about the same as the low voltage, Vss). When Vin is low (about the same as low the voltage, Vss), the first transistor is OFF and the output voltage is high (about the same as the high voltage, Vdd). The function of second transistor 204 is load, where the gate is connected to the drain.

Figure 2:
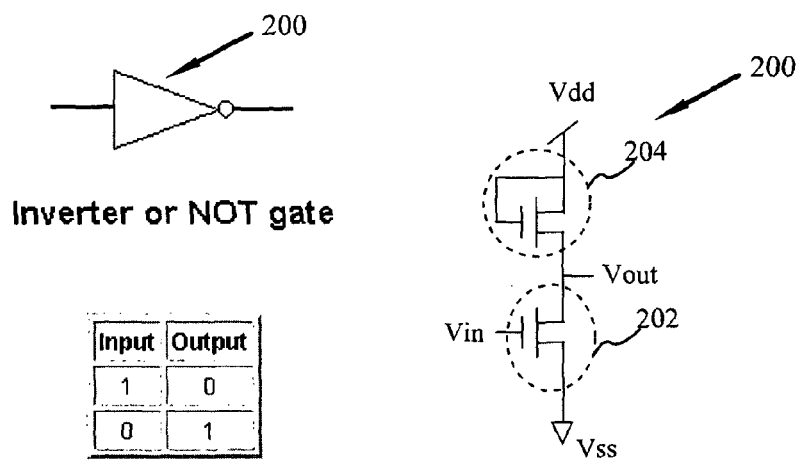
FIG. 2 provides a logic table and circuit diagram for an inverter according to an embodiment.

As shown in the Logic Table accompanying the circuit in FIG. 2, the logical value is "inverted."

Figure 3:
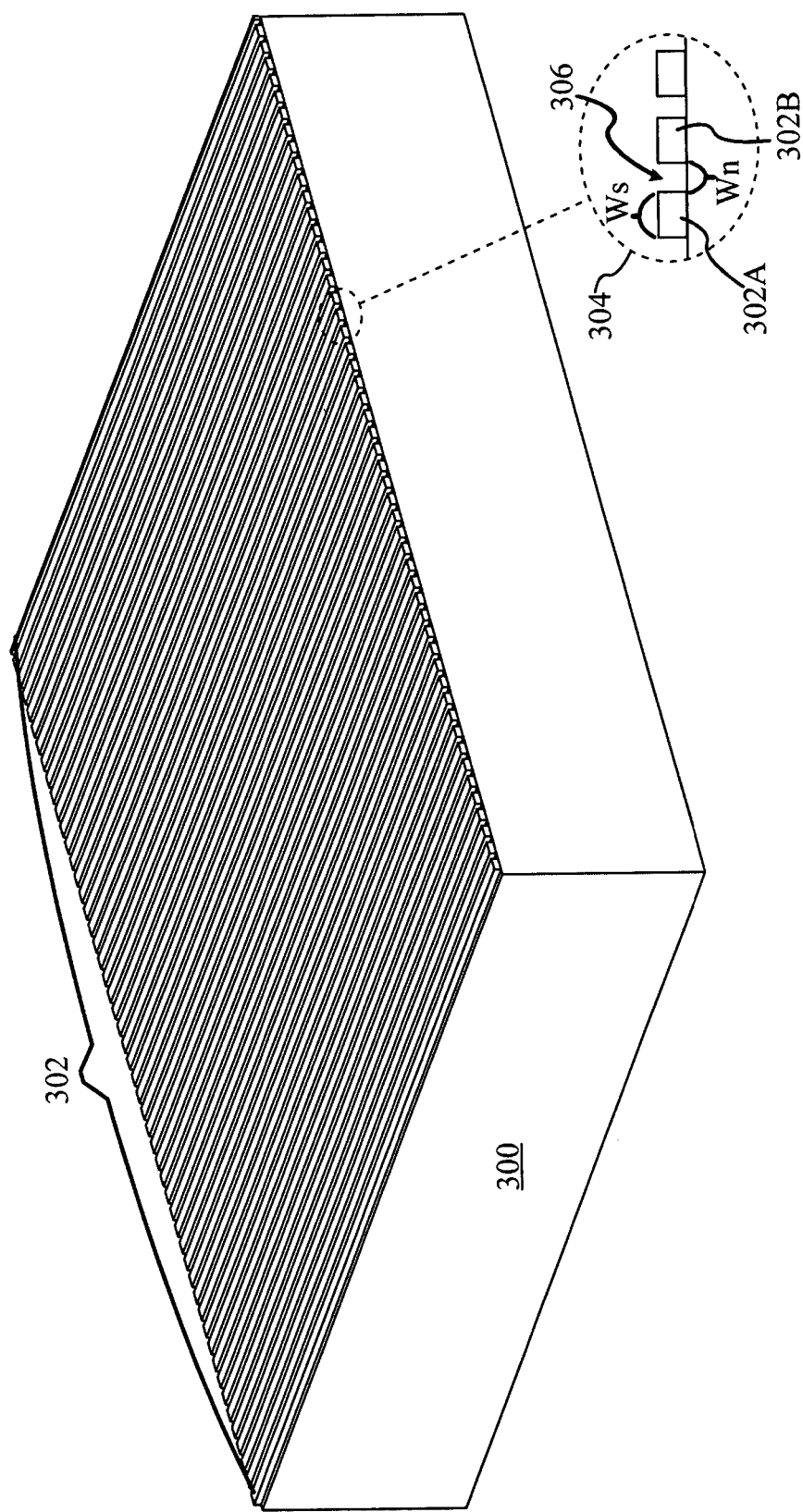
FIG. 3 is a perspective view of a substrate with a plurality of parallel spaced conductive strips in accordance with an embodiment.

In at least one embodiment, the fabrication of an inverter is shown to commence as illustrated in FIG. 3. As shown in FIG. 3, there is shown a portion of a substrate 300 upon which are provided a plurality of parallel spaced conductive strips 302. Typically, the substrate 300 is chemically cleaned to remove any particulate matter, organic, ionic and/or metallic impurities or debris which may be present upon the surface of the substrate 300 before the conductive strips 302 are provided.

In at least one embodiment, substrate 300 is a flexible substrate, such as, for example, a polyimide plastic sheet with or without an inorganic coating. Further, substrate 300 may be transparent. In at least one alternative embodiment, substrate 300 is both flexible and transparent, such as polyethylene teraphathalate (PET).

Conductive strips 302 may be provided by any number of different methods, such as, for example, depositing a metal film upon the substrate 300 and performing imprint lithography upon the metal film to define a plurality of parallel conductive strips 302. Briefly stated, an imprint polymer is used as a mask pattern for the conductive strips 302. The residual imprint material and then the exposed portion of the metal film are removed. The imprinted polymer is then removed, resulting conductive strips ready for subsequent device processing. In at least one embodiment, the conductive strips 302 are provided by such a method.

In an alternative embodiment, the parallel conductive strips 302 may be provided by a lift-off method. Generally summarized, imprint lithography is performed upon substrate 300. The residual imprint material is removed and a metal film is deposited upon the imprint structure and the substrate 300. By removing the imprinted structure (i.e. lifting-off the structure) the portion of the metal film upon the imprinted structure and thus above the substrate 300 is removed, thus providing a plurality of conductive strips 302 upon the substrate 300. In the lift-off process the polymer used for the imprint structure is in effect used as a negative mask pattern for the desired conductive strips 302.

As is further shown in the enlarged section bounded by dotted line 304, in at least one embodiment the conductive strips (e.g., conductive strips 302A~302B) are evenly spaced. In addition, in at least one embodiment the width "Ws" of each conductive strip 302 is at least equal to the width "Wn" of the space, e.g., nano-gap 306, separating the conductive strips 302A and 302B. In at least one embodiment the width (Ws) of each conductive strip 302 is between about 1 to 5 µm with the width (Wn) of each nano-gap 306 therebetween equal to or less than the width of each conductive strip 302 (e.g., Ws≧Wn). Specifically, in at lest one embodiment Ws is between about 1 to 5 µm and Wn is between about 100 to 400 nm.

In at least one embodiment the conductive strips 302 are established as substantially straight parallel features as shown. In at least one alternative embodiment, the conductive strips 302 may be as zigzagging parallel features.

Figure 4:
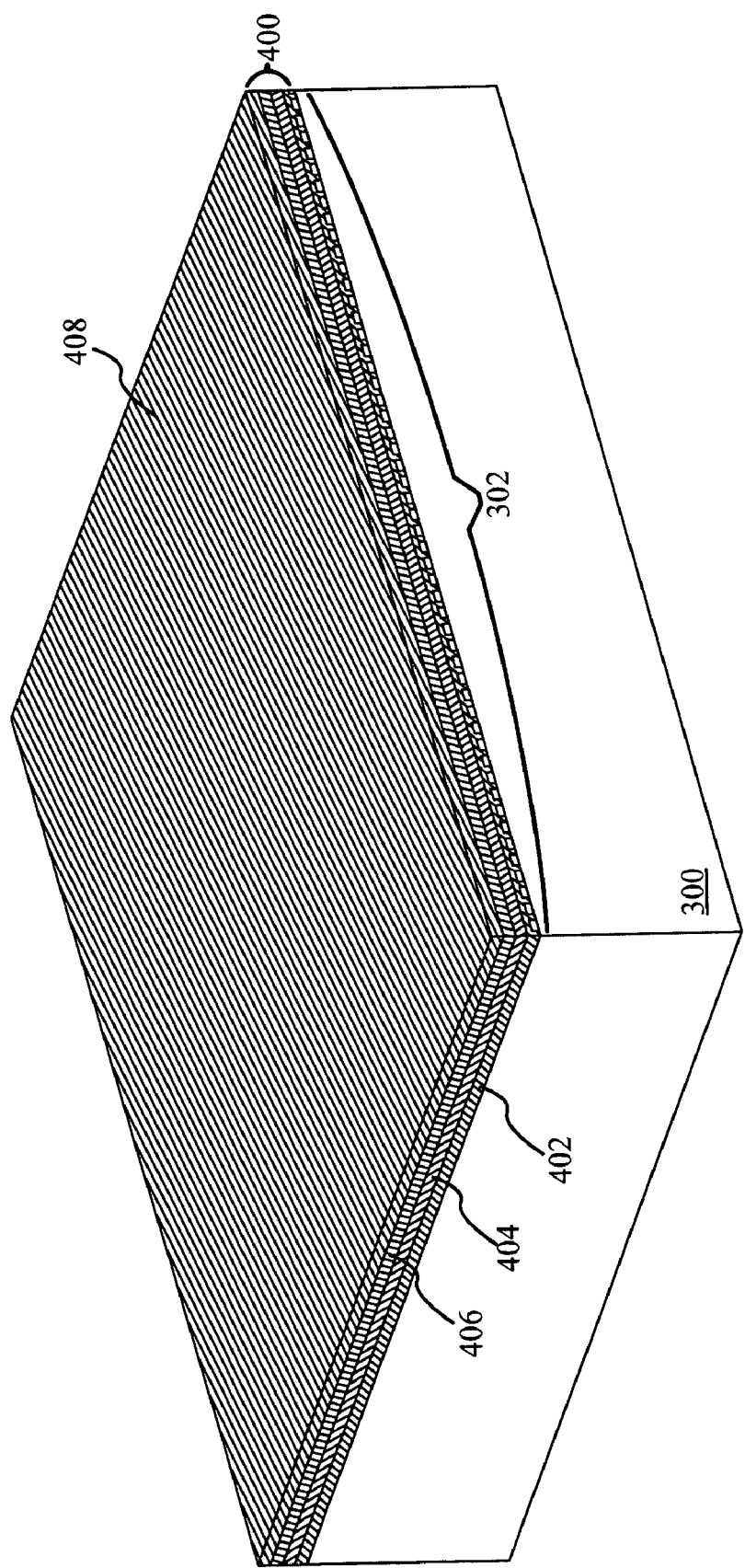
FIG. 4 is a perspective view of a plurality of thin film device layers deposited upon the conductive strips of FIG. 3 in accordance with an embodiment.

As shown in FIG. 4, a plurality of thin film layers are deposited upon the conductive strips 302 as a stack 400. Stack 400 is functional material, which is to say that it will function in a known manner when treated or exposed to specific stimuli such as for example electrical fields, currents, voltages, magnetic fields, wavelengths of light, temperatures, fluidic effects, chemicals, or the like. In at least one embodiment, the functional material, e.g. stack 400, includes a dielectric layer 402, a semiconductor layer 404, a doped semiconductor layer 406, and a top metal layer 408.

It is understood and appreciated that other pluralities of thin film layers may be deposited in place of, or in addition to the exemplary stack 400. It should also be understood and appreciated that although top metal layer 408 has been illustrated as a substantially solid layer, in at least one embodiment top metal layer 408 may actually be a layer of conductive strips akin to conductive strips 302. In addition, in certain embodiment it may be desired to provide additional layers of conductive strips as part of the deposited thin film stack 400, such as for the fabrication of devise where interconnection between devices is desired.

It is to be appreciated that the stack 400 of film layers does not provide a conductive layer (e.g., a doped semiconductor or metal layer) proximate to conductive strips 302, or more specifically, below the semiconductor layer 404. For the resulting TFD 1500 as fabricated, the bottom conductors are stranded conductors provided by a bundled subset of conductive strips (see FIG. 15). With respect to the two transistors shown in FIG. 15, e.g. 1404, 1406, no conductive element is disposed between the stranded conductors and their associated channels 1400, 1402.

Returning to FIG. 4, deposition of each material layer within stack 400 may be accomplished by vacuum deposition, gravure coating, sputtering, roll-to-roll deposition equipment, spin casting, ion beam deposition, electron beam evaporation, metal organic deposition (MOD), chemical vapor deposition (CVD) or such other method as is appropriate for the material being deposited. It is understood and appreciated that each material layer within stack 400 is deposited uniformly. Further, although each thin film layer within the stack 400 has been illustrated as a single layer, each may in actuality be established from multiple layers. Each thin film layer has been illustrated as a single layer for ease of discussion and illustration.

In at least one embodiment, the stack 400 of thin film layers is a stack of silicon nitride, amorphous silicon, N+ doped microcrystalline or amorphous silicon and aluminum. In embodiments where substrate 300 is transparent, and the resulting device is intended to be transparent or semi-transparent as well, transparent conductive materials such as indium tin oxide may be used. Other transparent conductive and semiconductor materials may also be used, such as, for example, ZnO as well as certain organic and doped semiconductor materials. Transparent dielectrics such as, for example, $Si_3N_4$ or $AL_2O_3$ may also be used.

Figure 5:
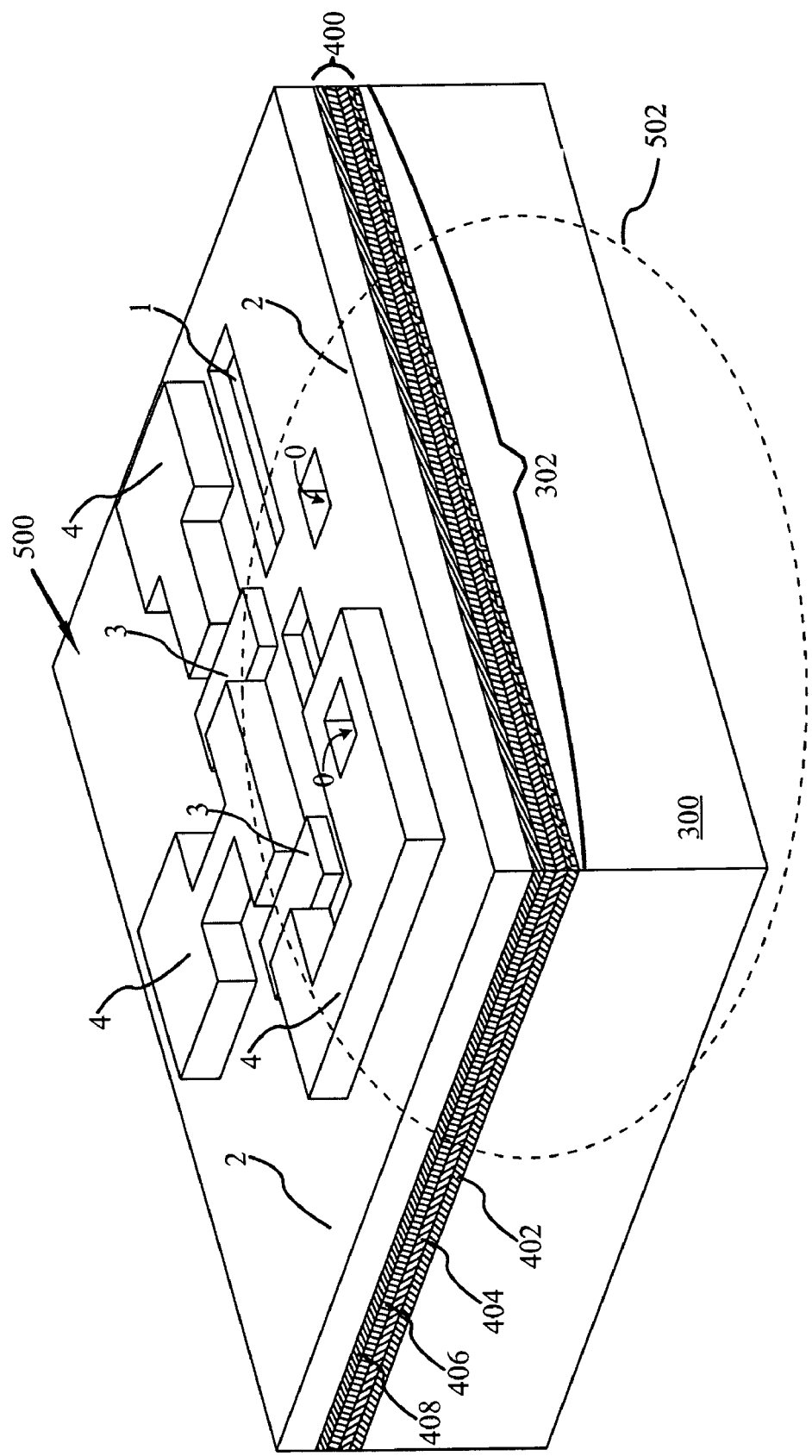
FIG. 5 is a perspective view of a 3D structure provided upon the stacked thin film device layers of FIG. 4 in accordance with an embodiment.

Shown in FIG. 5, a 3D structure 500 having a plurality of different vertical heights is provided upon stack 400. In at least one embodiment, a polymer, such as an imprint polymer or resist, is deposited upon the stack 400, and then imprinted by a stamping tool to provide 3D structure 500. The resist or polymer may incorporate any of a variety of commercially available polymers. For example, a polymer from the Norland optical adhesives (NOA) family of polymers could be used. A silicone material may also be used as is described in U.S. patent application Ser. No. 10/641,213 entitled "A Silicone Elastomer Material for High-Resolution Lithography", which is herein incorporated by reference.

A method for utilizing a stamping tool to generate a 3D structure in a layer of material is described in U.S. patent application Ser. No. 10/184,587 entitled "A Method and System for Forming a Semiconductor Device", which is herein incorporated by reference. A stamping tool is further described in U.S. patent application Ser. No. 10/903,300 entitled "Imprint Stamp", which is herein incorporated by reference. With further respect to roll-to-roll processing where substrate 300 may be of arbitrary size, yet another method for providing a 3D structure 500 is described in U.S.

Pat. No. 6,808,646, entitled "Method of Replicating a High Resolution Three-Dimension Imprint Pattern on a Compliant Media of Arbitrary Size", which is also herein incorporated by reference.

Generally speaking, when employing a stamp and polymer, a stamping tool is brought into contact with the polymer, thereby displacing the polymer layer into the 3D pattern provided by the stamping tool. Typically, the displaced polymer is then cured, such as by UV light exposure, or any other suitable curing means.

It is further understood and appreciated, that 3D structure 500 is described as having different vertical heights, the dimension of reference being normal to the substrate 300. As is more fully explained below, at least one height of the 3D structure 500 defines a first portion of the conductive strips to be bundled. In addition, 3D structure 500 provides at least three different vertical heights.

As shown, in the exemplary embodiment of fabricating an inverter, 3D structure 500 provides five levels of substantially different vertical heights, levels 0, 1, 2, 3 and 4. Level 0 defines portions of the conductive strips 302 to be bundled. Level 1 defines portions of the conductive strips 302 to be severed, and levels 2, 3 and 4 define the further elements of the eventual inverter TFD 1500. Under appropriate circumstances 3D structure 500 may be provided with greater or fewer vertical heights so as to provide different thin film devices separate from or in connection with the TFT as exampled herein.

Figure 6:
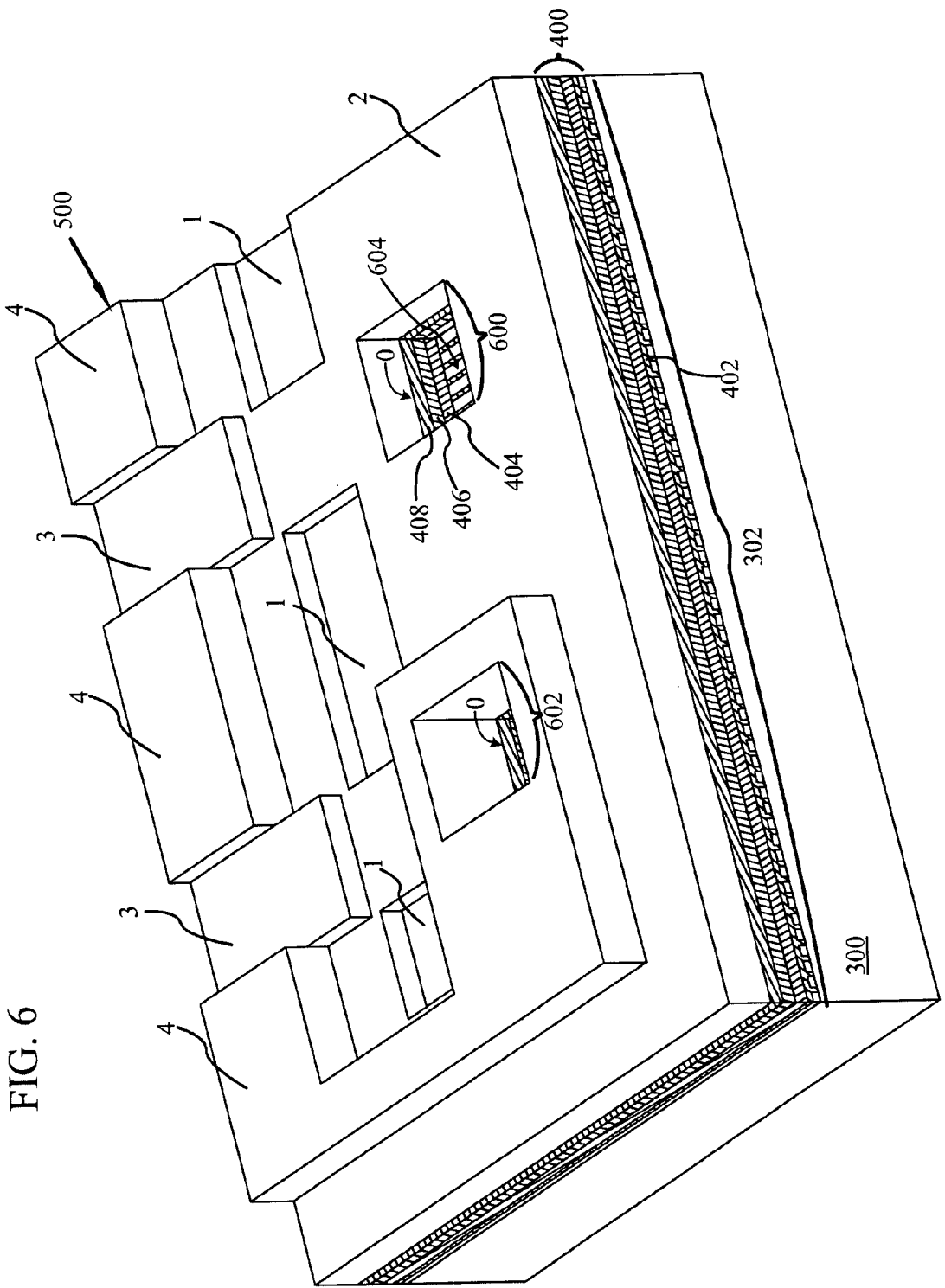
FIG. 6 is an enlarged perspective view of a portion of the developing structure shown in FIG. 5, showing the exposed conductive strips below the 3D structure in accordance with an embodiment.

FIG. 6 is an enlarged area corresponding generally to the area in FIG. 4 bounded by dotted line 502. As shown in FIG. 6, 3D structure 500 is then etched to effectively remove the structure material from the first lowest level, e.g., level 0, thereby establishing apertures 600, 602. Apertures 600, 602 exposes the topmost layer of stack 400. As is most easily appreciated with respect to aperture 600, etching is continued with appropriate etchants to remove successive layers from stack 400 and expose the conductive strips 302, specifically a first portion of conductive strips 604 lying beneath aperture 600. In at least one embodiment, the etching is accomplished by a reactive ion etching process (RIE).

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching. Physical ion etching is also typically referred to as a dry process. A physical etching process is typically very anisotropic.

In an assisted physical process such as a reactive ion etching (RIE) process, removal of material comes as a combined result of chemical reactions and physical impact. Generally, the ions are accelerated by a voltage applied in a vacuum. The effect of their impact is aided by the introduction of a chemical which reacts with the surface being etched. In other words, the reaction attacks and removes the exposed surface layers of the material being etched.

The reactive ion etching process may have a high selectivity of etching one material over other materials. For example, oxygen plasma may have a high etch selectivity of polymer over silicon or metal materials. In other words, an RIE process advantageously permits accurate etching of one or more material layers with little appreciable effect upon other material layers. Moreover, RIE permits selective etching to remove specific layers (e.g., dielectric layer 402, semiconductor layer 404, doped semiconductor layer 406 and top metal layer 408) so as to expose the first portion of conductive strips 604. Further, the removal of these specific layers is substantially limited to the area defined by 3D structure 500 at level 0.

Figure 7:
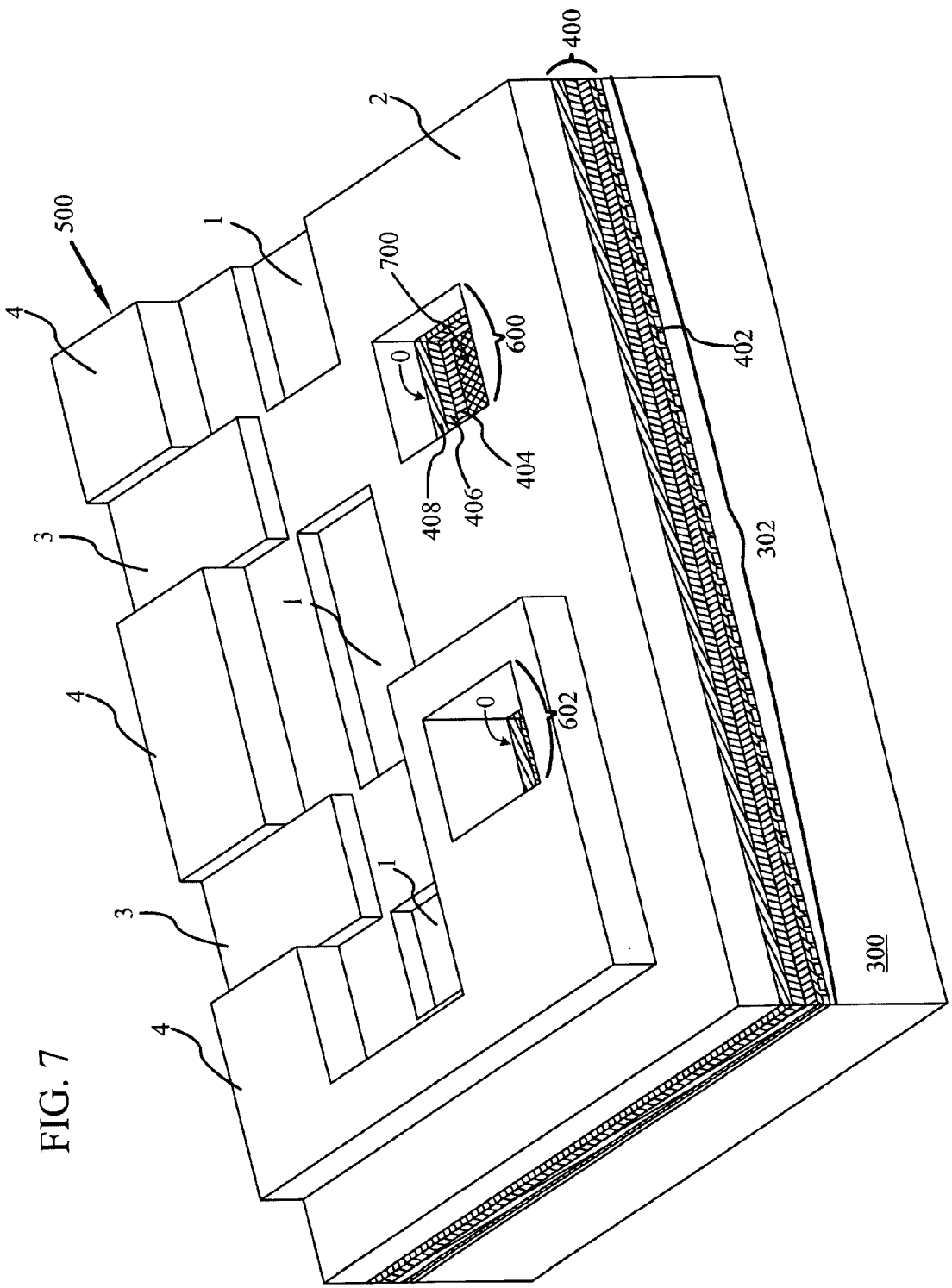
FIG. 7 is a perspective view showing a conductive pad provided upon the conductive strips shown in FIG. 6 in accordance with an embodiment.

FIG. 7 illustrates a conductive pad 700 that is provided upon the exposed first portion of conductive strips 604 shown in FIG. 6. In at least one embodiment, conductive pad 700 serves as a bundling conductor, bundling first portion of conductive strips 604 so as to insure that each of the conductive strips passing beneath 3D structure 500 level 3, defining respective channels, are at substantially about the same voltage. As will be further discussed and describe below, conductive pad 700 also serves in part to insure proper alignment of the gate control (first portion of conductive strips 604) to the channel. With respect to FIG. 7, it is understood and appreciated that a conductive pad 700' is established within aperture 602, although the conductive pad within aperture 602 is not visible in FIG. 7 as illustrated. (see FIG. 17).

Conductive pad 700 may be provided by a number of different techniques. In the case of at least one embodiment, where the conductive strips 302 are fabricated from a material containing chrome, the chrome may be used as a seed layer in a electroplating or electroless plating operation. As the first portion of conductive strips 604 are only exposed in apertures 600, 602, occurring where the initial 3D structure 500 level was 0, the formation of conductive pad 700 is limited to the desired area.

In at least one alternative embodiment, conductive pad 700 is provided with the use of an ink-jet device providing a semi-fluid conductive material to apertures 600, 602. A fabrication process incorporating such a device and applicable for roll-to-roll fabrication processes is set forth in U.S. patent application Ser. No. 11/062384 entitled "A Method For Forming an Electronic Device", which is herein incorporated by reference.

Figure 8:
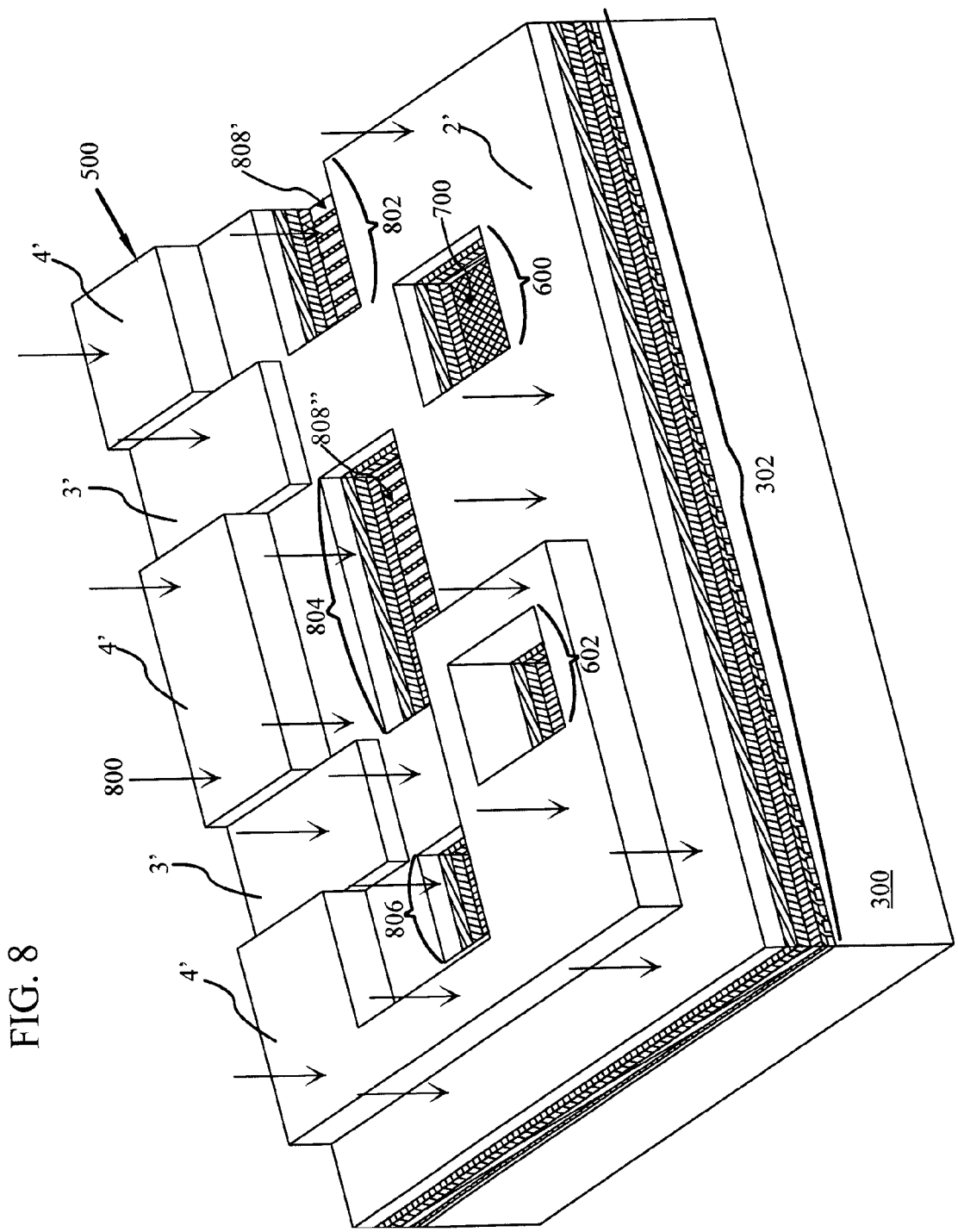
FIG. 8 is a perspective view illustrating an etching process to reduce the height of the 3D structure and expose a second area of conductive strips in accordance with an embodiment.

With respect to FIG. 8, the height of 3D structure 500 is reduced by the height of one level. In at least one embodiment, such a reduction in height is accomplished by etching, represented by arrows 800, thus reducing all remaining levels by a uniform amount. In other words, the 3D structure 500 is etched to remove the second lowest layer, e.g., level 1. Removal of the polymer material at level 1 creates apertures 802, 804, 806 that expose stack 400. As with apertures 600, 602 (see FIG. 6) etching processes are continued to expose at least one second portion of conductive strips 808', 808" in apertures 802, 804. Conductive strips are also exposed in aperture 806 though not shown in FIG. 8 due to the angle of perspective. The use of selective etchant in an RIE process permits selectively etching substantially only the materials desired.

Figure 9:
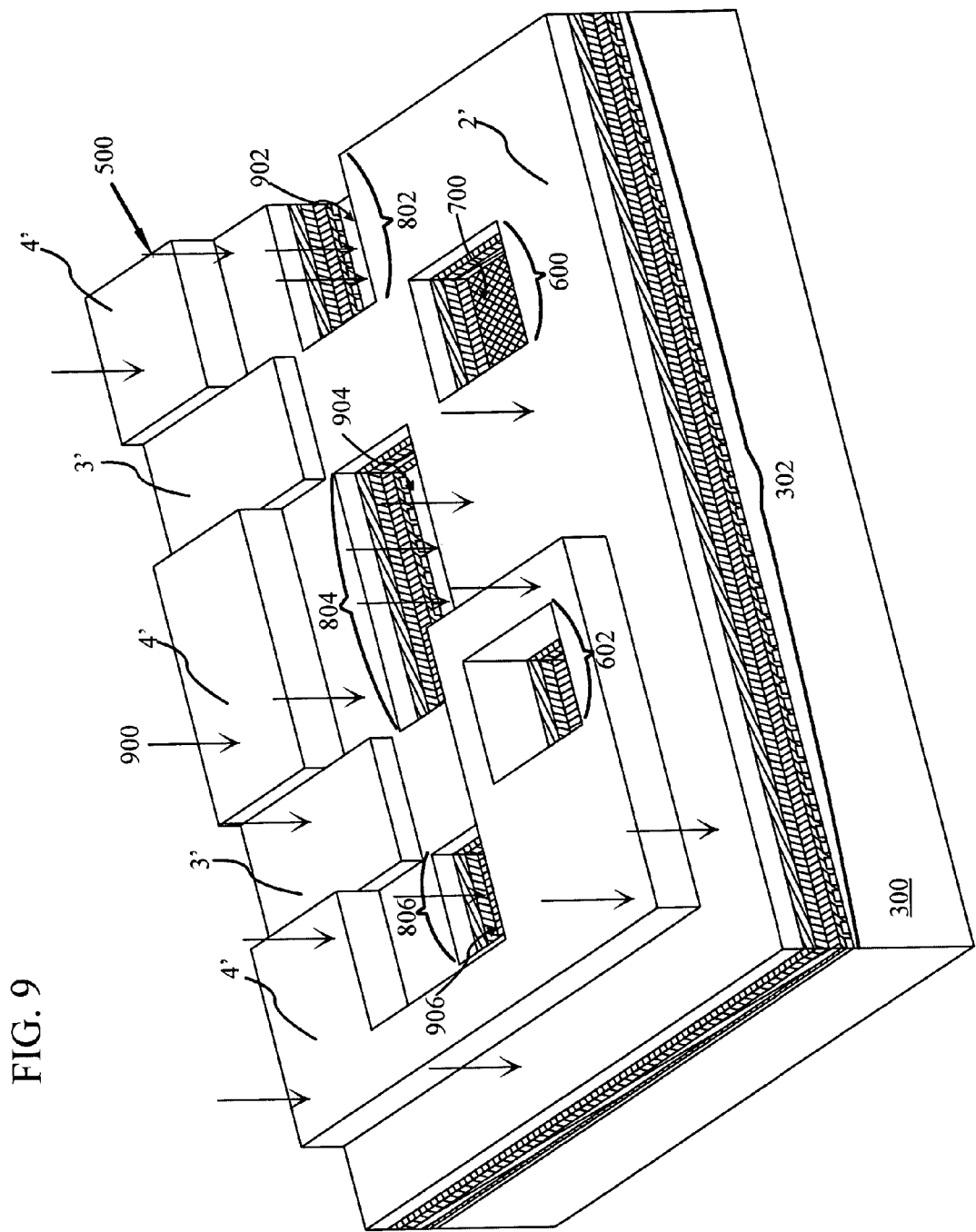
FIG. 9 is a perspective view illustrating an etching process to provide cut off vias in accordance with an embodiment.

As illustrated in FIG. 9, the exposed second portions of conductive strips 808 are severed. In at least one embodiment, this is accomplished by performing a further RIE process, as illustrated by arrows 900. Where conductive strips 302, and specifically second portions of conductive strips 808 are formed from chrome material, the exposed second portions of conductive strips 808 may be etched in a Cr etchant such as CR-7s made by Cyantek.

In other words, as the etchant is selective for the material forming the conductive strips 302, the exposed second portions of conductive strips 808 are removed while the other materials are not significantly etched or otherwise removed as the etching, represented by arrows 900, is performed across the surface. Cut-off vias 902, 904, 906 are thus established adjacent to the conductive strips below conductive pad 700, and more specifically, the conductive strips that run beneath 3D structure 500 level 3', the area that will ultimately define the channels of the first and second transistors in the inverter.

Figure 10:
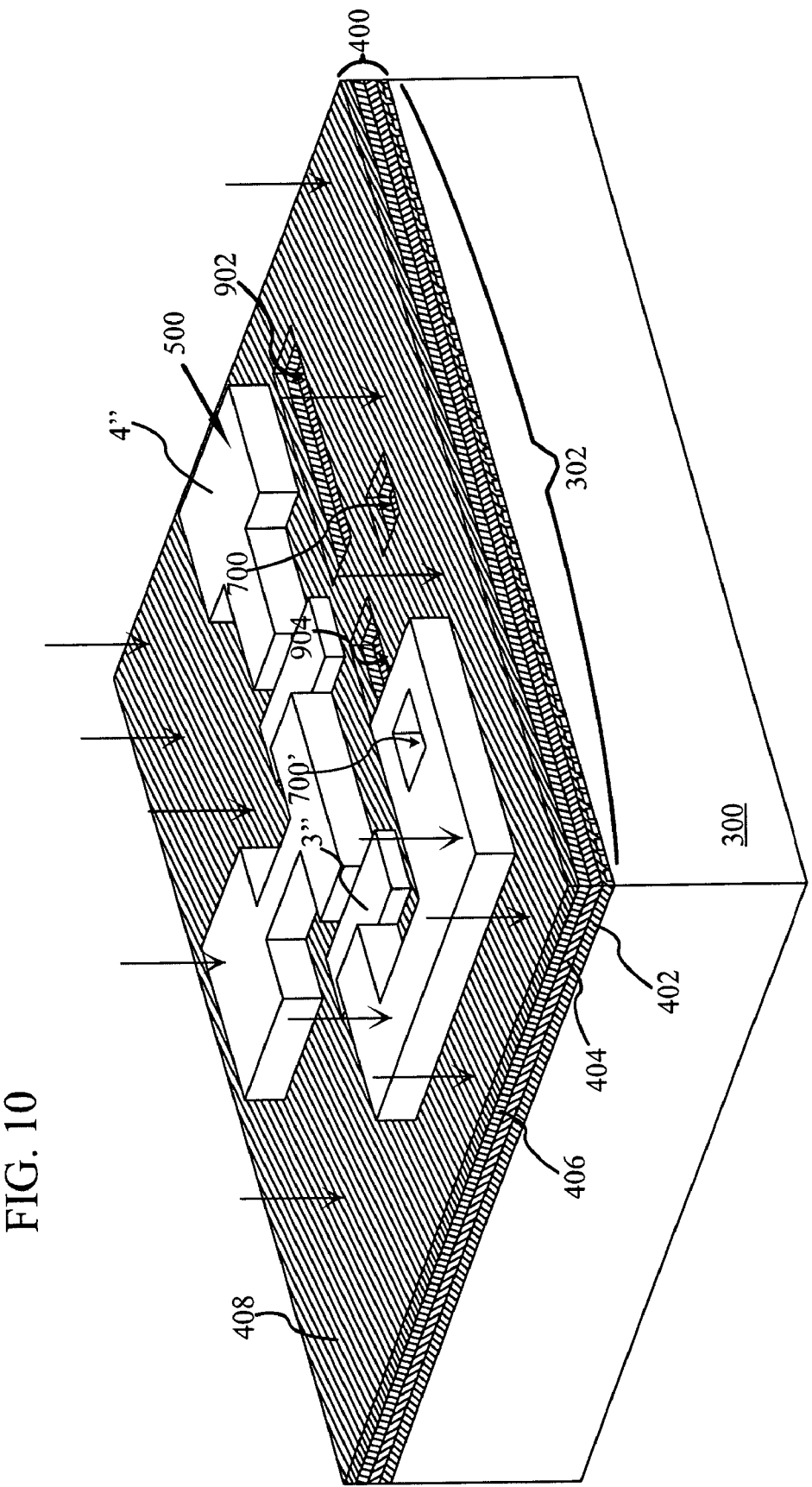
FIG. 10 is a perspective view similar to FIG. 5 showing an etching process to reduce the height of the 3D structure and expose portions of the thin film device layers in accordance with an embodiment.

FIG. 10 returns to the perspective view showing a greater portion of the developing TFD. As indicated in FIG. 10, the height of 3D structure 500 is again reduced by a height of one level. In at least one embodiment, such a reduction in height is accomplished by etching, e.g. an RIE process, as described above, shown as arrows 1000, thus reducing all remaining levels by a uniform amount. Moreover, the 3D structure 500 is etched to remove the third lowest level. 3D structure 500 now remains at levels 3" and 4", while the remaining material at level 2' had been removed, thus exposing the top of stack 400. As illustrated, areas of top metal layer 408 are now exposed.

Figure 11:
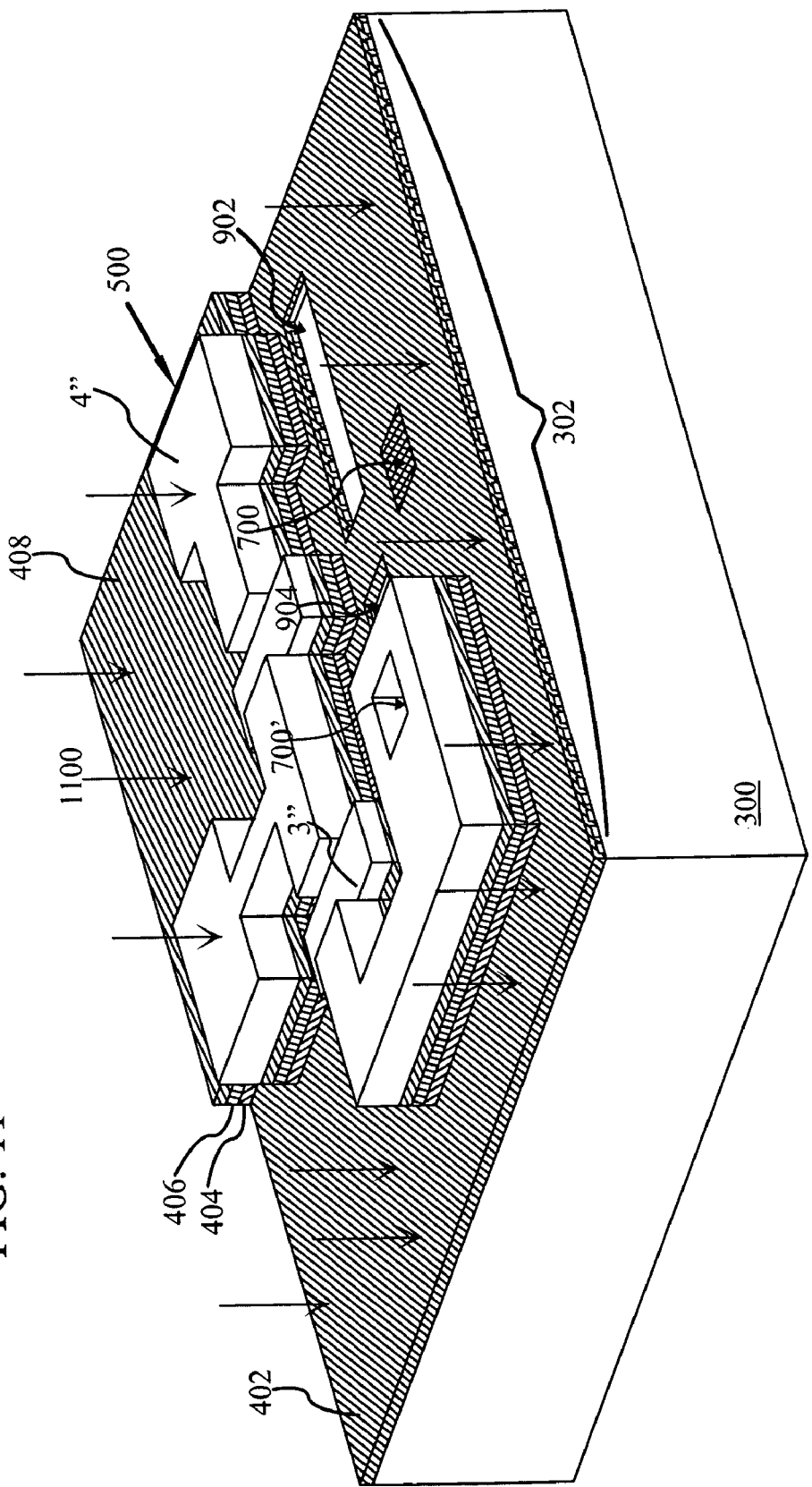
FIG. 11 is a perspective view showing an etching process to remove portions of the exposed thin film device layers shown in FIG. 10 in accordance with an embodiment.

As in FIG. 11, an RIE process is again performed, illustrated as arrows 1100, to substantially remove the exposed portions of top metal layer 408, and the subsequently exposed areas of the doped semiconductor 406 and semiconductor 404. The remaining 3D structure 500 at levels 3" and 4" serve to define areas of top metal layer 408 that will eventually serve as the first and second transistors of the inverter. Although FIG. 11 illustrates an exposed portion of metal layer 408 and a larger portion of exposed dielectric layer 402, generally an entire layer is removed before the subsequent lower layer is etched.

Figure 12:
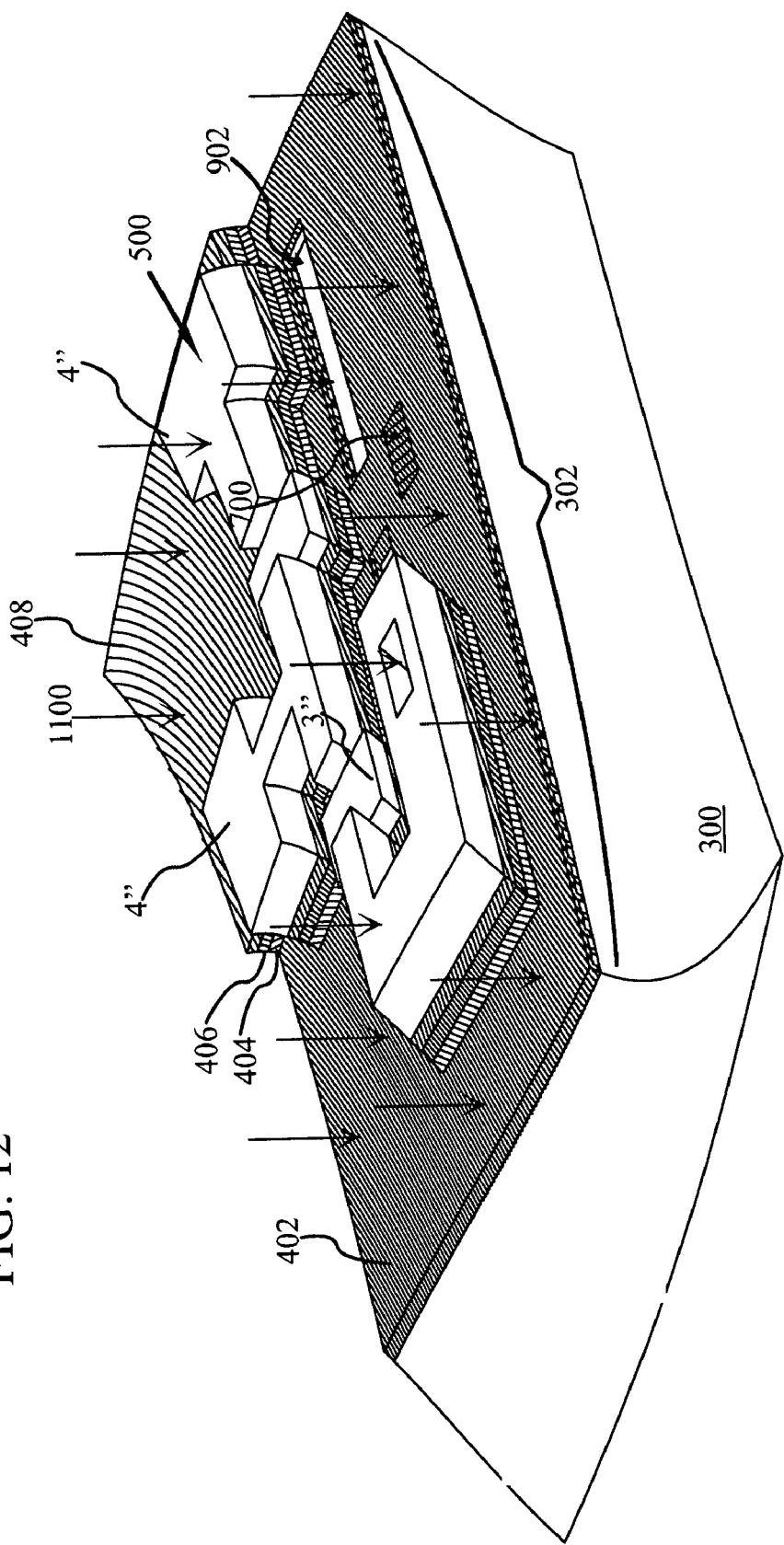
FIG. 12 is a perspective view illustrating the advantageous nature of the fabrication process to tolerate distortion in accordance with an embodiment.

Traditional lithographic processes such as photolithography involve the deposition of a layer, subsequent 2-D masking, and etching, and cannot tolerate substrate distortion without undermining the functionality of the intended device. FIG. 12 illustrates the highly advantageous nature of the SAIL process to effectively provide alignment with respect to each level of the 3D structure, the stack 400 of thin film layers, and the substrate 300, without respect to distortions. As illustrated, the distortion of the substrate 300 is propagated through the thin film layers (402~408) and the 3D structure 500. Moreover, the SAIL process and stranded conductors upon a flexible substrate permit fabrication of lightweight components with greater ruggedness then is typically found with components on non-flexible and typically brittle substrates.

Figure 13:
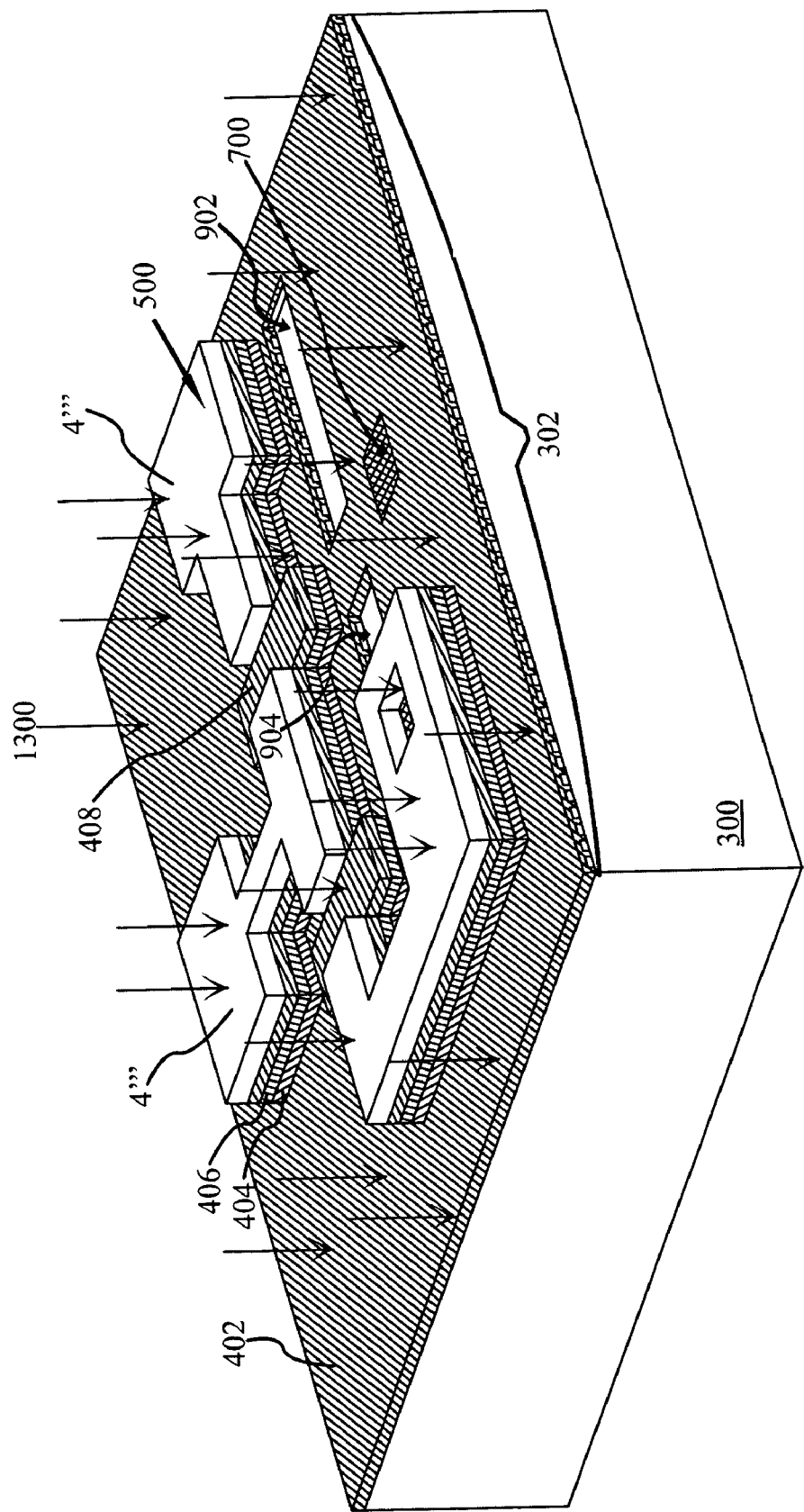
FIG. 13 is a perspective view showing an etching process to reduce the height of the 3D structure and expose portions of the thin film device layers in accordance with an embodiment.

As in FIG. 13, the height of 3D structure 500 is again reduced by a height of one level. In at least one embodiment, such a reduction in height is accomplished by etching, shown as arrows 1300, thus reducing all remaining levels by a uniform amount. Moreover, the 3D structure 500 is etched to remove the fourth lowest level. As such, stack 400 is exposed above, and in line with, the first portion of conductive strips passing beneath conductive pads 700 and bounded by cut off vias 902, 904, 906.

The remaining portion of 3D structure 500 is now only 4''', which continues to protect and define the portions of top metal layer 408 that will form source and drain electrodes for the first and second transistors of the inverter. As level 3" has been removed, top metal layer 408 is exposed in an area that will provide the channels for the first and second transistors of the inverter.

Figure 14:
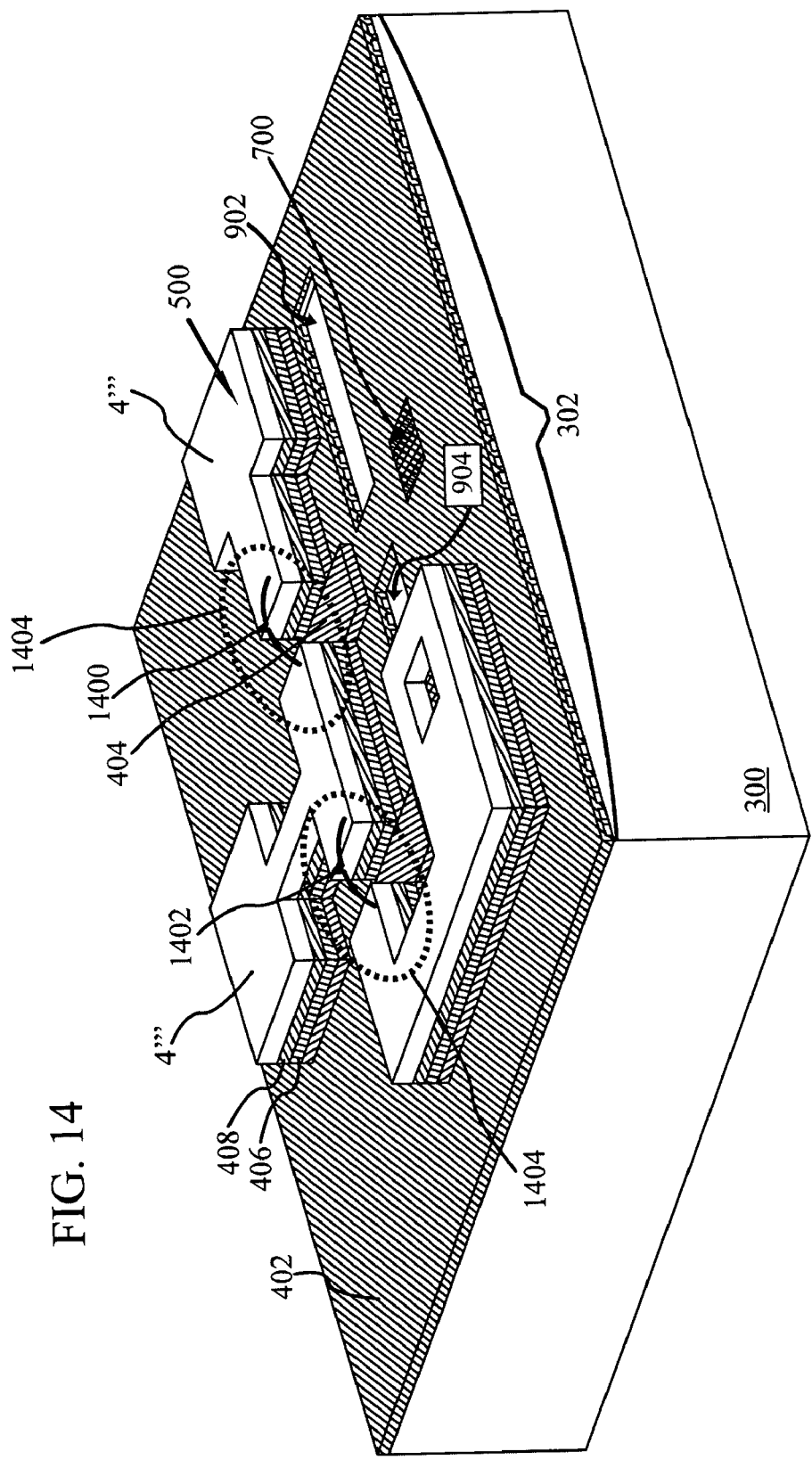
FIG. 14 is a perspective view showing the established channels provided by etching the structure as shown in FIG. 13 in accordance with an embodiment.
Figure 15:
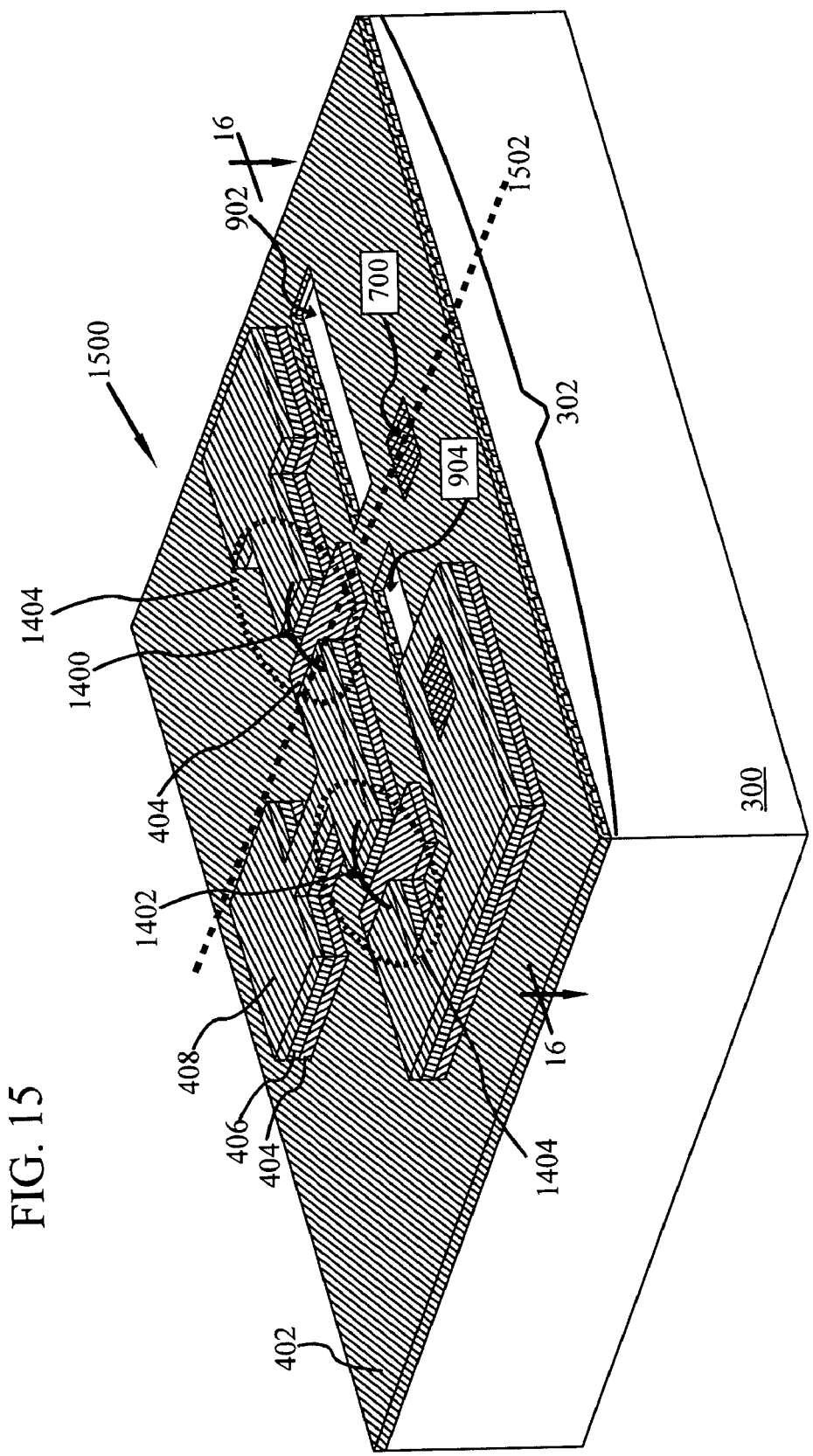
FIG. 15 is a perspective view of the established inverter TFD in accordance with an embodiment.

In FIG. 14, etching has been performed to remove first the exposed portion of the top metal layer 408 and the subsequent exposed portion of doped semiconductor 406 of stack 400 has been removed to establish channels 1400, 1402 for first and second transistors shown generally by dotted lines 1404, 1406.

in FIG. 15, the remaining portions of 3D structure 500 may be removed. A TFD 1500, specifically an exemplary inverter, with a bottom stranded conductor (illustrated as a dotted line 1502) may now be fully appreciated. Moreover, inverter is a TFD 1500 upon substrate 300 having a bottom stranded conductor 1502 provided by a bundled subset of conductive strips 302.

Figure 16:
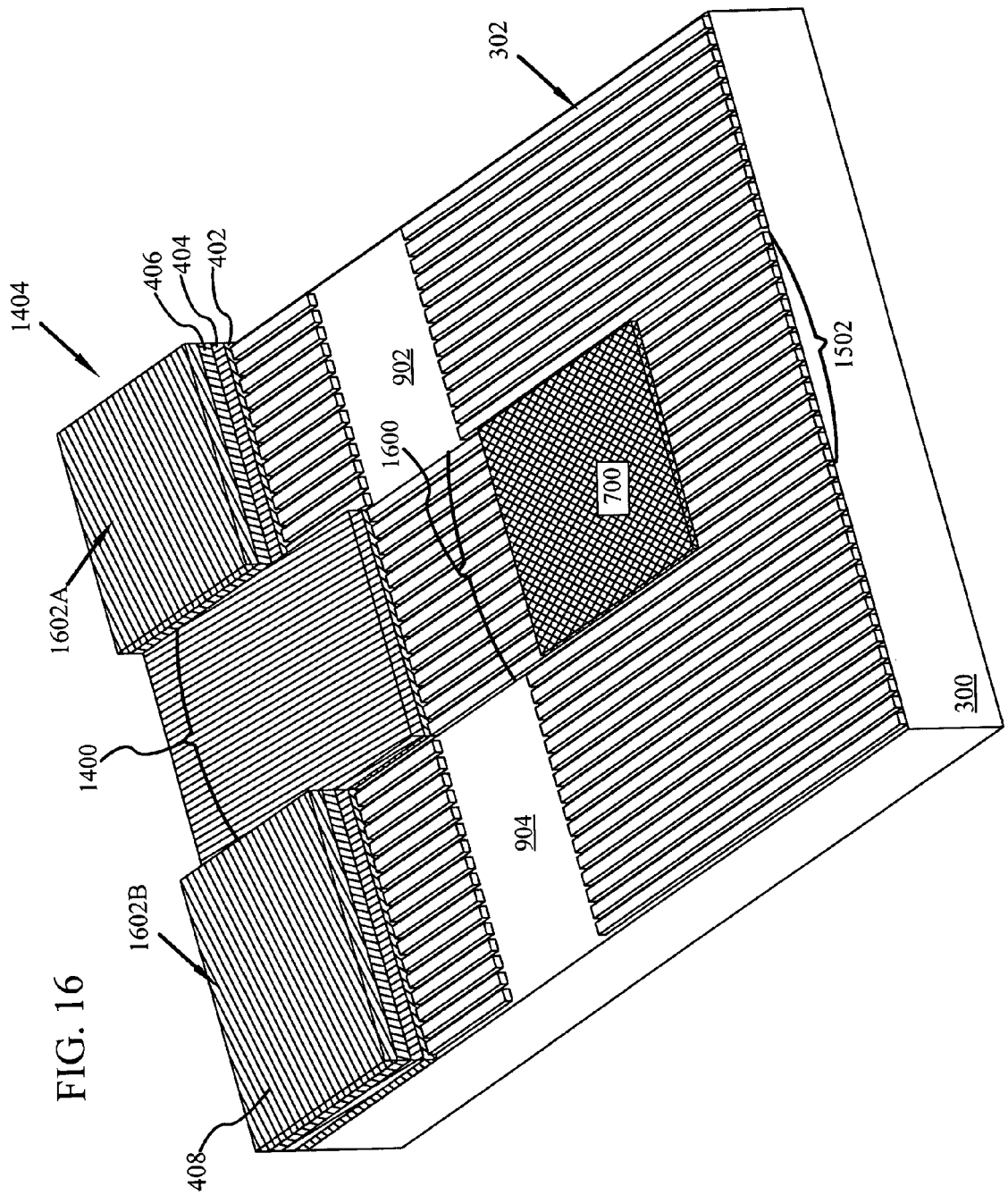
FIG. 16 is an enlarged partial cut away view of the first transistor of the established inverter TFD in FIG. 15 in accordance with an embodiment.
Figure 17:
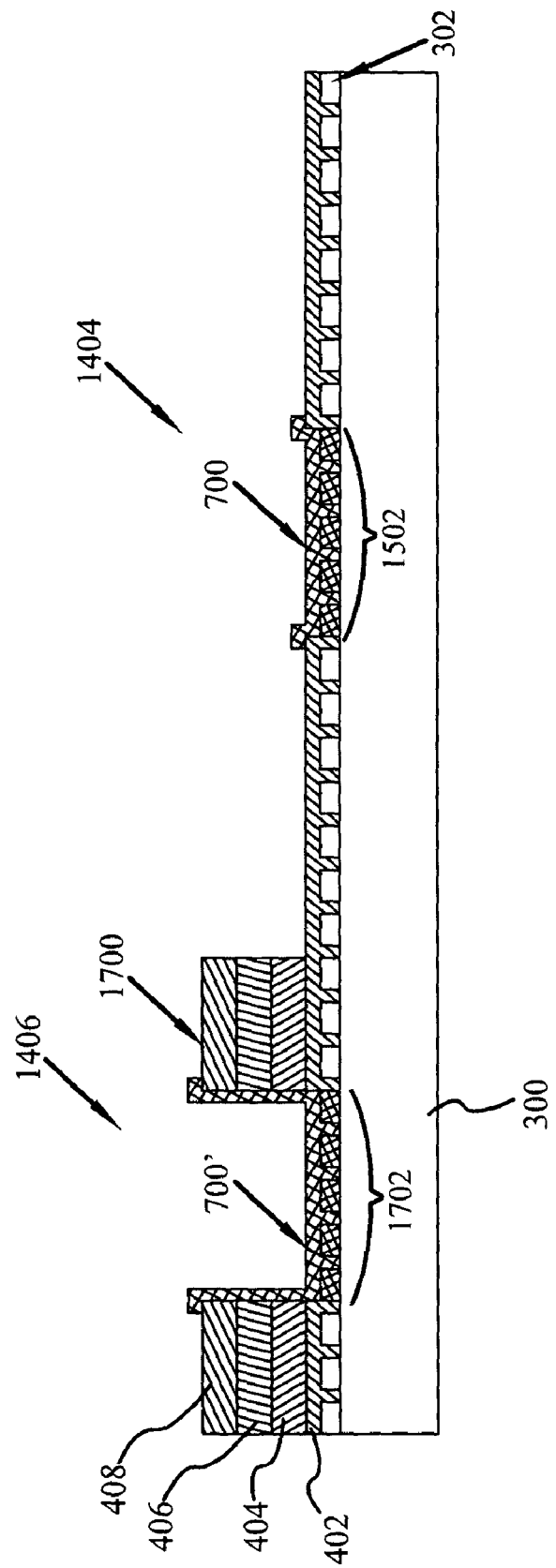
FIG. 17 is a side view cut away of the structure shown in FIG. 15 in accordance with an embodiment.

The structural arrangement of elements in TFD 1500 may be more fully appreciated in the enlarged partial cutaway portion presented in FIG. 16 and plane midsection view presented in FIG. 17. With respect to FIG. 16, bottom stranded conductor 1502 is shown as provided by a bundled subset of conductive strips 1600, bundled by conductive pad 700. Functional material in the form of at least one thin film layer is deposited upon at least a portion of the bundled subset of conductive strips 1600. In the illustrated embodiment this functional material is provided as semiconductor layer 404. A second conductor 1602A, 1602B, formed from top metal layer 408, is adjacent to the thin film layer (semiconductor layer 404) and separate from the bundled subset of conductive strips 1600.

As FIG. 16 illustrates a portion of first transistor, and specifically channel 1400, it may be apreciated that there is no conductive element such as for example a doped semiconductor or metal layer is disposed vertically between the stranded conductor 1502 providing the gate electrode and the channel 1400. The channel 1400 is also substantially transverse to the conductive strips 302. Cut-off vias 902, 904 are aligned with the edges of the channel 1400.

FIG. 17 illustrates the ability of the bundling material to also provide interconnects between a first layer of the TFD with a second layer of the TFD. With respect to the second transistor 1406, the top conductor 1700 provided by metal layer 408 is interconnected to the gate electrode provided by stranded conductor 1702. As with stranded conductor 1502, stranded conductor 1702 is provided by a bundled subset of conductive strips 302. Moreover, the 3D structure 500 permits fabrication of interconnects between layers with respect to the second transistor 1406, and also permits isolation between layers with respect to the first transistor 1404.

As the physical structure of the TFD 1500 is established by the 3D contour of 3D structure 500 provided by an imprinting process, there is minimal overlap between the source/drain electrodes and the gate electrode for each transistor in TFD 1500. More specifically, in at least one embodiment, there is no appreciable overlap between the source, drain and gate electrodes.

Moreover, the alignment of the source, drain and gate electrodes is established very early on in the fabrication process and is not subject to skew or later misalignment as occurs with traditional lithographic processes. As such, TFD 1500 advantageously minimizes parasitic capacitance.

In a typical TFT, the gate electrode is a solid conductor, a structure that may be viewed as having no nano-gaps. The channel current is controlled by both the vertical (perpendicular to the channel surface) as well as the lateral (source—drain direction) electrical field. For an n-channel TFT, when a positive voltage is applied to the gate electrode, there is an electrical field in the vertical direction established in the channel.

Figure 18:
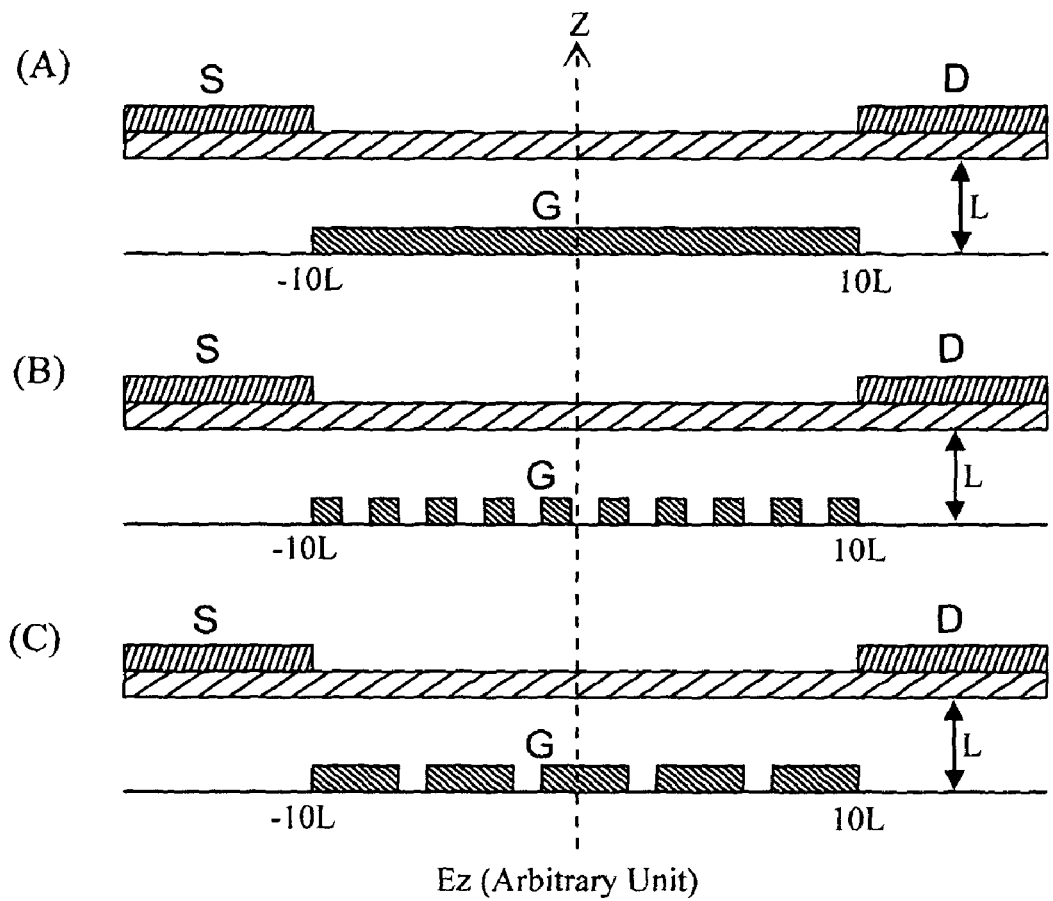
FIG. 18 provides graphical simulation data regarding the performance of TFDs with nano-gaps in the gate conductor.
Figure 18:
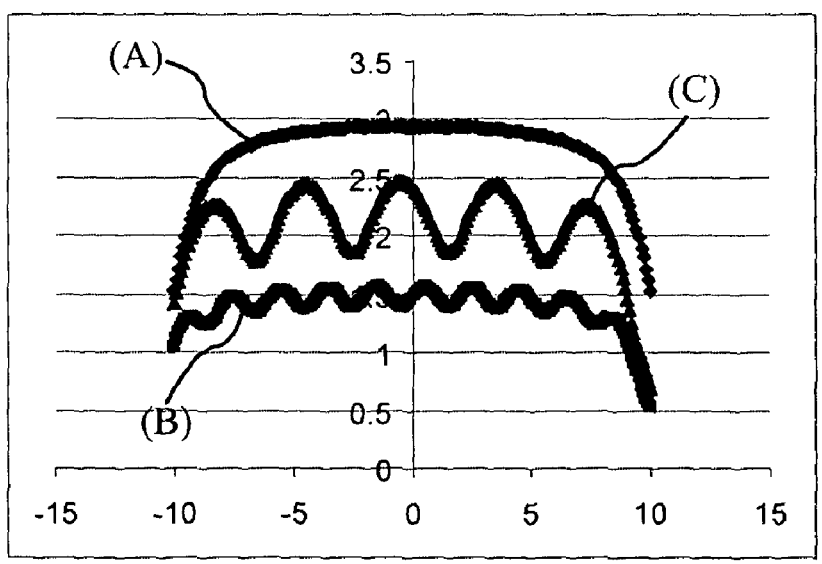

The vertical field induces electron carriers accumulated in the channel. The amount of induced charges is proportional to the strength of the vertical field. The channel current is related to the amount of induced charges in the channel and the lateral field. FIG. 18 illustrates simulation results of the field strength of the vertical component for three different gate electrodes: (A) a solid electrode; (B) a gate electrode consisting of ten segments with three hundred nm width and three hundred nm nano-gap spacing therebetween; and (C) a gate electrode consisting of five segments with nine hundred nm width and three hundred nm nano-gap spacing therebetween.

When working with two parallel conductors, the field strength of the vertical component is uniform in the middle portion. The field strength at the edge (e.g., the fringe field/edge field effect) of the parallel conductors is generally about half of what is present in the middle portion. When the gate conductor is subdivided into smaller elements cooperatively acting as a larger gate electrode, there is a reduction of the field strength depending upon the ratio of conductive strip width and the width of the nano-gaps for a given dielectric thickness.

As a direct result of the nano-gap gate configuration, there will be less charge accumulation resulting in less device on-current. Therefore, compared with a conventional TFT, the source drain current will be reduced by the proportion of the total accumulated width of the nano-gaps versus the total accumulated width of the conductive strips providing the gate electrode. However, if the ratio between the width of the conductive strips and the nano-gaps is large enough, the current reduction can be insignificant for device performance. More specifically, this reduction can be compensated for by increasing the channel width to supply the current required by the application intended for the device.

As in the fabrication process shown and described above, it is to be understood and appreciated that there is no conductive element such as a doped semiconductor or metal conductor coupled to the stranded conductors in vertical alignment between the stranded conductors 1502, 1702 and their respective channels 1400, 1402. TFD 1500 is therefore structurally different from multi-gate transistors as they employ a conductive element coupled to the channel that spans the multi-gate elements.

Moreover, TFD 1500 relies on fringe field and carrier diffusion to allow the electric carriers in the channel to conduct across the gap. This is functionally different from a multi-gate transistor as a traditional multi-gate transistor relies on connecting the source of one transistor the drain of a neighboring transistor to establish the channel current. Moreover a multi-gate transistor typically functions as a series of smaller, single gate transistors cooperatively working as a collective whole.

As stated above, in at least one embodiment, the assembled TFD 1500, and more specifically the array of assembled TFDs, are flexible. Use of individual conductive strips may further facilitate ease of flexibility. As the conductive strips are provided before the stack of thin film layers and 3D structure are provided, as discussed above, these is a possibility for the skew between the conductive strips providing the gate control and the channel.

Figure 19:
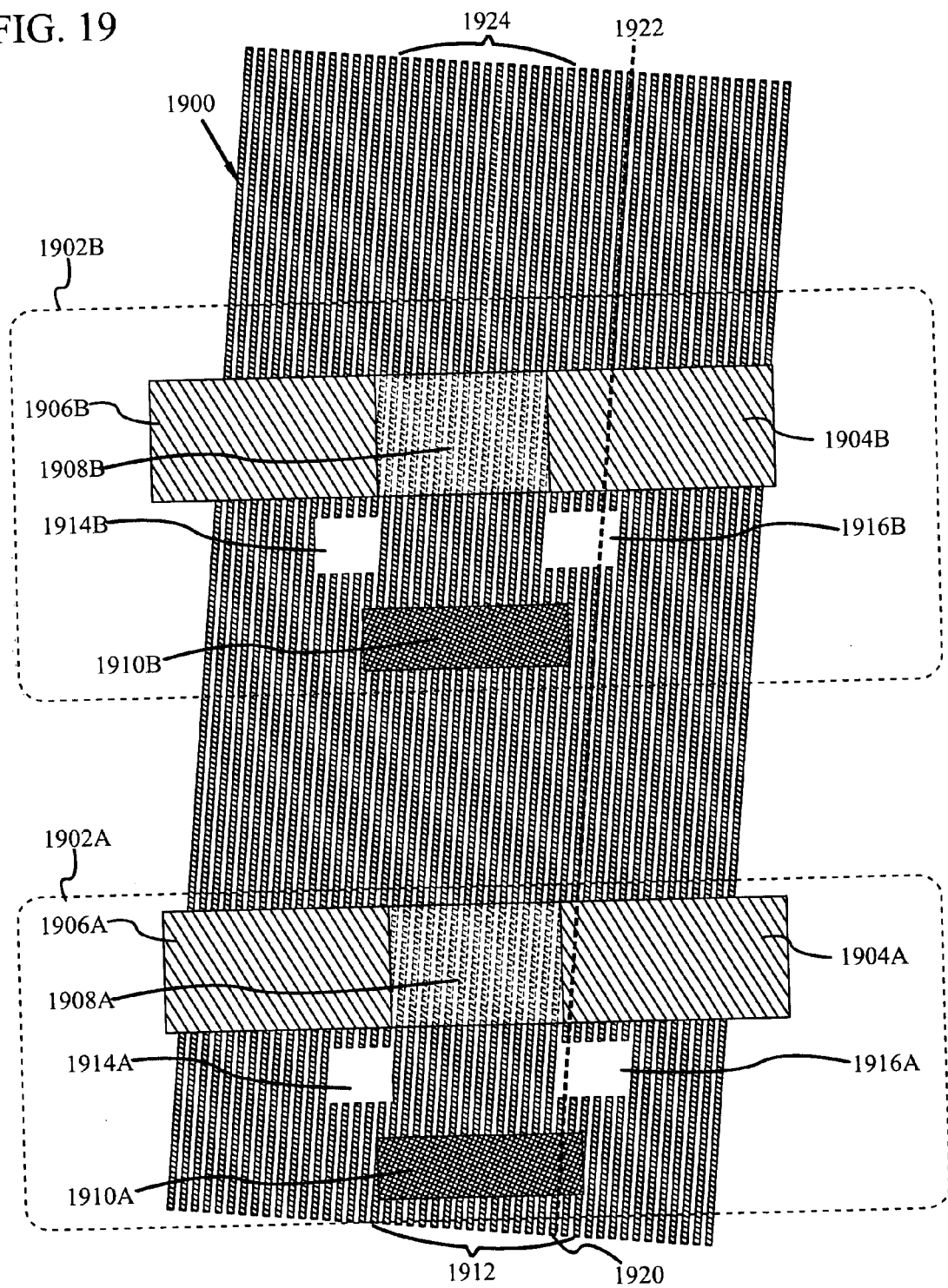
FIG. 19 illustrates the gate to channel re-alignment properties of stranded conductor in accordance with an embodiment.

FIG. 19 illustrates the advantageous re-alignment properties inherent to TFD 1500. More specifically, FIG. 19 is a partial top view showing a plurality of conductive strips 1900, substantially identical to those conductive strips discussed and described above. Formed upon the conductive strips are two TFT devices, 1902A, 1902B. With respect to TFT device 1902A, a drain electrode 1904A and source electrode 1906A are aligned to a channel 1908A. A subset 1912 of conductive strips 1900 are bundled together by conductive pad 1910A that are aligned to pass beneath channel 1908A. Cut-off vias 1914A, 1916A are aligned to channel 1908A and thus interrupt the conductive strips 1900 on either side of channel 1908A. Moreover, the severed strips lie in the same plane as the bundled subset of conductive strips.

As illustrated, the conductive strips 1900 are not ninety degree transverse to the channels 1908A, 1908B. The skew has been exaggerated for ease of illustration and discussion. As shown, conductive strip 1920 is a member of subset 1912, running beneath conductive pad 1910A. As illustrated by dotted line 1922, conductive strip 1920, if un-interrupted, would pass just to the right of channel 1908A, and would be significantly under drain 1904B—conditions that would result in significant parasitic capacitance. Cut off via 1916A prevents this from occurring.

Moreover, bundled subset 1912, although acceptable to channel 1908A, is not acceptable to channel 1908B. Conductive pad 1910B providing a new bundled subset 1924 and vias 1914B, 1916B serve to realign each stranded conductor (e.g. gate control electrode) to each channel. In other words, the gate control provided by bundled subset 1912 for channel 9808A is shifted slightly to bundled subset 1924 as an aligned gate control for channel 1908B.

With respect to FIG. 19, it is also to be appreciated that the bundling material providing conductive pad 1910A is at least as wide as channel 1908A, and may be wider. As shown, cut-of vias 1914A, 1916A insure that a gate control of proper width is provided beneath channel 1908A. Although skew may permit some instance of overlap and/or gap which may generate parasitic capacitance, such overlap and/or gap is advantageously limited to one conductive strip 1900 on either side of the channel 1908A. Thus, in the event of a gap and/or overlap, the parasitic capacitance is advantageously minimized.

Moreover, the use of the parallel spaced conductive strips to provide the gate conductor and a SAIL process to define the overall structure and relationship between components of TFD 1500 permits the fabrication of TFDs on a smaller scale then is possible with traditional photo-lithographic techniques. In addition, the alignment properties, interconnect properties, and isolation properties demonstrated with respect to an inverter as an exemplary TFD 1500 are applicable to other TFDs as well.

Moreover in at least one embodiment, the TFD to be fabricated, or plurality of TFD's be fabricated are selected from the group including NOT gates, AND gates, OR gates, NOR gates, cross point thin film memory devices, and combinations thereof. As suggested by the name, cross point thin film memory devices are established from thin films that may be patterned and processed by an embodiment of the above process. An example of a cross point thin film memory device is described in U.S. Pat. No. 6,385,075, entitled "Parallel Access of Cross-Point Diode Memory Array", which is herein incorporated by reference.

Further, although the above discussion and illustrations have focused upon an inverter established upon a layer of conductive strips 302, it is to be understood and appreciated that additional layers of conductive strips may be employed in certain fabrication processes desiring interconnects between different layers and/or different devices.

In at least one embodiment, the method of forming at least one TFD 1500 with a stranded bottom conductor is performed as a roll-to-roll process, also referred to as web processing. In roll-to-roll processing, the substrate 300 (and resulting layered structure) may be several meters wide and several meters, if not kilometers long. Roll-to-roll process is therefore an advantageous method when fabricating large devices such as backplanes for video displays.

Figure 20:
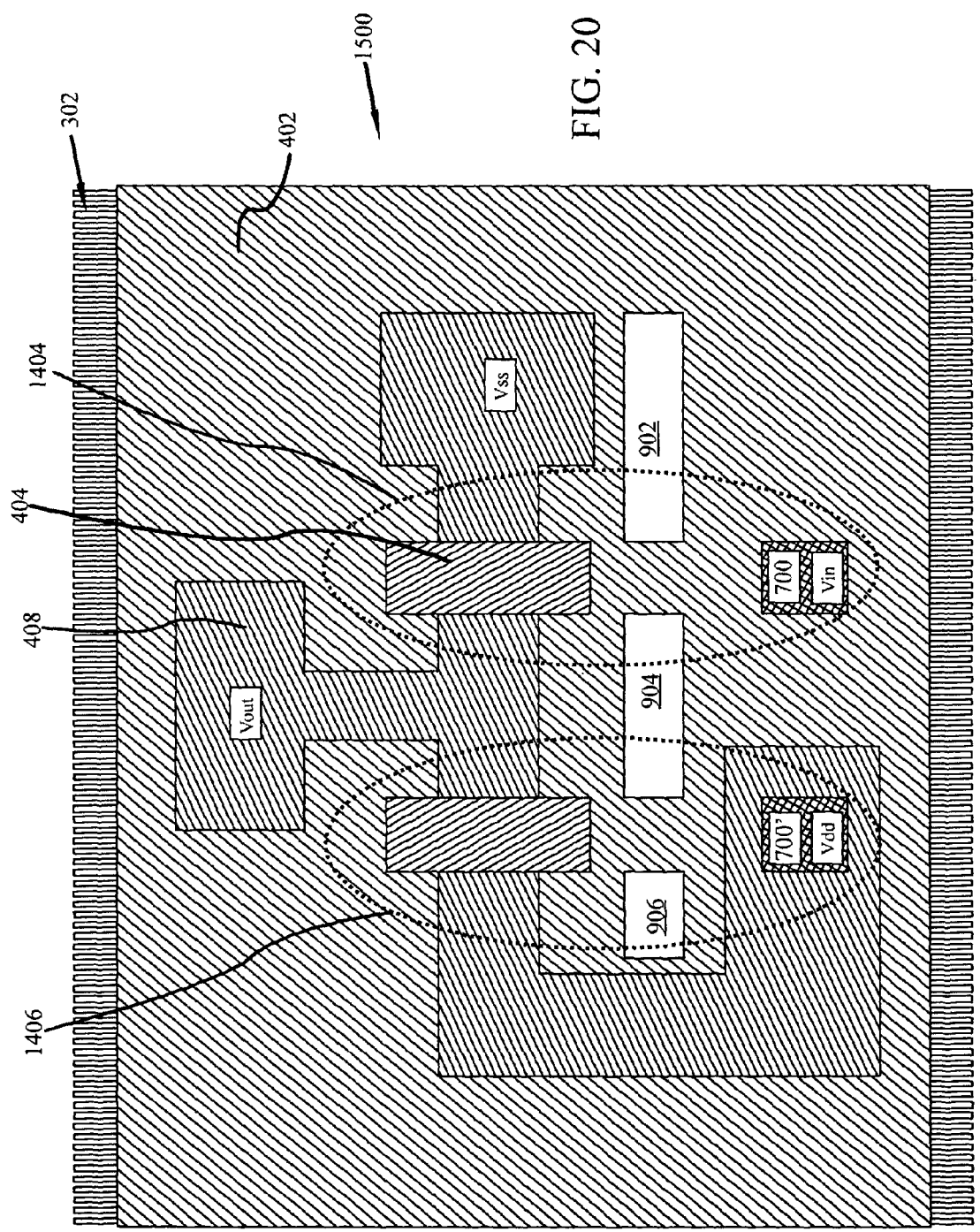
FIG. 20 illustrates an top view of the exemplary inverter TFD in accordance with an embodiment.

FIG. 20 illustrates a top view of the resulting TFD 1500 as fabricated above, e.g., an inverter. Vin, Vout, Vdd and Vss as initially presented in the circuit diagram of FIG. 2 are clearly identified. Dielectric layer 402 is shown to cover the majority of conductive strips 302, Cut off vias 902, 904 and 906 clearly bound the stranded bottom conductors achived by conductive pads 700, 700' which control the gates of first transistor 1404 and second transistor 1406.

Transparent TFDs may be provided by utilizing transparent materials, by providing devices of such minute scale and with intervening aperture spacing, or by combining both transparent materials with a minute scale. The ability to provide a matrix of high quality TFDs as transparent or semi-transparent backplane displays may be highly desirable in the fabrication of video displays. For example, heads-up displays as might be used to display navigation information on the windshield of a vehicle (car, aircraft, submarine, etc . . . ) may advantageously be easily fabricated.

Changes may be made, in the above methods, systems and structures without departing from the scope thereof. It should thus be noted that the matter contained in the above description and/or shown in the accompanying drawings should be interpreted as illustrative and not in a limiting sense. The following claims address all generic and specific features described herein, as well as all statements of the scope of the present method, systems and structure which, as a matter of language, might be said to fall therebetween.

What is claimed is:

1. A TFD with stranded conductor, comprising:
   a substrate;
   a plurality of parallel spaced electrically conductive strips upon the substrate;
   a bottom stranded conductor provided by a bundled subset of the parallel spaced electrically conductive strips;
   at least one thin film device layer disposed upon at least a portion of the bundled subset of the parallel spaced electrically conductive strips, the bundled subset of conductive strips collectively providing a segmented electrode; and
   a second conductor adjacent to the thin film device layer and separate from the bundled subset of the parallel spaced electrically conductive strips.

2. The TFD of claim 1, wherein the substrate is flexible.

3. The TFD of claim 1, wherein the TFD is a cross-point device.

4. The TFD of claim 1, wherein the second conductor is above the thin film device layer.

5. The TFD of claim 1, further including at least one conductive strip adjacent to the bundled subset of conductive strips being severed.

6. The TFD of claim 5, wherein the at least one severed conductive strip lies in the same plane as the bundled subset of conductive strips.

7. The TFD of claim 5, wherein the at least one severed conductive strip and the bundled subset of the parallel spaced electrically conductive strips align the bottom stranded conductor to a specific portion of the thin film device layer.

8. The TFD of claim 1, wherein a conductor is not coupled to the bundled first portion of conductive strips vertically disposed beneath a specific portion of the thin film device layer within the TFD.

9. The TFD of claim 1, wherein the second conductor is a stranded conductor.

10. A TFD with stranded conductor, comprising:
    a substrate;
    a plurality of parallel spaced electrically conductive strips upon the substrate;
    a bottom stranded conductor provided by a bundled subset of the parallel spaced electrically conductive strips, at least one electrically conductive strip adjacent to the bundled subset of the parallel spaced electrically conductive strips being severed, the bundled subset of the parallel spaced electrically conductive strips provided by a conductive bundling material disposed upon the subset of the parallel spaced electrically conductive strips;
    at least one thin film device layer disposed upon at least a portion of the bundled subset of the parallel spaced electrically conductive strips; and
    a second conductor adjacent to the thin film device layer and interconnected to the bundled subset of the parallel spaced electrically conductive strips by the bundling material.

11. The TFD of claim 10, wherein the substrate is flexible.

12. The TFD of claim 10, wherein the TFD is selected from the group consisting of a NOT gate, an AND gate, an OR gate, an NOR gage, a cross point device, and combinations thereof.

13. The TFD of claim 10, wherein the second conductor is above the thin film device layer.

14. The TFD of claim 10, wherein the at least one severed conductive strip lies in the same plane as the bundled subset of conductive strips.

15. The TFD of claim 10, wherein the at least one severed conductive strip and the bundled subset of the parallel spaced electrically conductive strips align the bottom stranded conductor to a specific portion of the thin film device layer.

16. The TFD of claim 10, wherein a conductor is not coupled to the bundled first portion of conductive strips vertically disposed beneath a specific portion of the thin film device layer within the TFD.

17. The TFD of claim 10, wherein the second conductor is a stranded conductor.

18. The TFD of claim 7, wherein the specific portion of the thin film device layer is a channel.

19. The TFD of claim 15, wherein the specific portion of the thin film device layer is a channel.

20. The TFD of claim 1, wherein each TFD incorporates at least two conductive strips as a segmented electrode.

21. The TFD of claim 10, wherein each TFD incorporates at least two conductive strips as a segmented electrode.

* * * * *

UNITED STATES PATENT AND TRADEMARK OFFICE
CERTIFICATE OF CORRECTION

| | | |
|---|---|---|
| PATENT NO. | : 7,994,509 B2 | Page 1 of 1 |
| APPLICATION NO. | : 11/264321 | |
| DATED | : August 9, 2011 | |
| INVENTOR(S) | : Mei et al. | |

It is certified that error appears in the above-identified patent and that said Letters Patent is hereby corrected as shown below:

In column 1, line 42, after "individual" insert -- nature --.

In column 11, line 64, before "in" insert -- As shown --.

In column 16, line 26, in Claim 12, delete "gage," and insert -- gate, --, therefor.

Signed and Sealed this
Sixth Day of March, 2012

David J. Kappos
*Director of the United States Patent and Trademark Office*